(12) United States Patent
Gandhi et al.

(10) Patent No.: US 10,028,405 B1
(45) Date of Patent: Jul. 17, 2018

(54) FLEXIBLE DATA CENTER RACK ALLOCATION

(71) Applicant: Amazon Technologies, Inc., Reno, NV (US)

(72) Inventors: Jignesh Gandhi, Ashburn, VA (US); Robert Anthony Smith, Leesburg, VA (US); Dong Wang, Seattle, WA (US); Ross Michael Wampler, Seattle, WA (US); Wei Liu, Bellevue, WA (US); Junlin Yi, Seattle, WA (US); Justin Michael Dodson, Alexandria, VA (US); Adam Thomas Creswell, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 904 days.

(21) Appl. No.: 14/494,437

(22) Filed: Sep. 23, 2014

Related U.S. Application Data

(60) Provisional application No. 61/987,453, filed on May 1, 2014.

(51) Int. Cl.
  *H05K 7/14* (2006.01)
  *H05K 7/18* (2006.01)
(52) U.S. Cl.
  CPC ............ *H05K 7/18* (2013.01); *H05K 7/1491* (2013.01); *H05K 7/1492* (2013.01)
(58) Field of Classification Search
  CPC .... H05K 7/1498; H04L 41/146; G06Q 10/06; G06F 17/509
  See application file for complete search history.

(56) References Cited

U.S. PATENT DOCUMENTS

| | | |
|---|---|---|
| 9,585,282 B1 | 2/2017 | Gandhi et al. |
| 9,606,316 B1 | 3/2017 | Gandhi |

(Continued)

FOREIGN PATENT DOCUMENTS

WO    WO-2008144375 A2 * 11/2008 ............ G06Q 10/06

OTHER PUBLICATIONS

Dave Cole, "The Information Source for the Data Center Industry Data Center Knowledge Guide to Data Center Infrastructure Management (DCIM) Data Center Knowledge Guide to DCIM", May 2012, Downloaded from https://connect.ufl.edu/cns/DCO/dcim/White%20Papers/1_19292_DCK_Guide_to_DCIM_Final.pdf, pp. 1-19.

(Continued)

*Primary Examiner* — Brian W Wathen
(74) *Attorney, Agent, or Firm* — Robert C. Kowert; Meyertons, Hood, Kivlin, Kowert & Goetzel, P.C.

(57) ABSTRACT

A data center rack allocation system allocates rack computer systems to be installed at particular rack positions based at least in part upon correlating infrastructure support requirements of the rack computer systems with infrastructure support capacities associated with the rack position. Such allocation can enable rapid incremental deployment of infrastructure and rack computer systems in a data center with flexibility to allocate various types of rack computer systems, with various support requirements, to available infrastructure. The system can identify infrastructure connections available to provide certain types of support capacity and can associate such connections with various rack positions in data centers. The system can determine the support requirements of a rack computer system in response to a determination that the rack computer system is presently inbound for delivery to a data center. The system can (Continued)

allocate particular infrastructure connections to a rack computer system allocated to a rack position.

18 Claims, 9 Drawing Sheets

(56) References Cited

U.S. PATENT DOCUMENTS

| | | | | |
|---|---|---|---|---|
| 2004/0088145 | A1* | 5/2004 | Rosenthal | G06F 17/509 |
| | | | | 703/1 |
| 2005/0071134 | A1* | 3/2005 | Shahoumian | G06F 17/509 |
| | | | | 703/1 |
| 2008/0144375 | A1 | 6/2008 | Cheng | |
| 2009/0138313 | A1 | 5/2009 | Morgan et al. | |
| 2011/0213735 | A1 | 9/2011 | Cao et al. | |
| 2013/0190899 | A1 | 7/2013 | Slessman et al. | |
| 2013/0232888 | A1 | 9/2013 | Crosby, Jr. | |
| 2013/0233532 | A1 | 9/2013 | Imwalle et al. | |
| 2013/0265705 | A1* | 10/2013 | Schmitt | H05K 7/1488 |
| | | | | 361/679.02 |
| 2015/0253829 | A1* | 9/2015 | Palmer | G06F 1/28 |
| | | | | 713/300 |
| 2015/0324487 | A1* | 11/2015 | Lee | G06F 17/50 |
| | | | | 703/21 |

OTHER PUBLICATIONS

Power Point Presentation, "Designing a Scalable Network Infrastructure", Dr. Natheer Khasawneh, Rafat A. Dasan, 2007, pp. 1-31.
Cisco, "Design for a Productive Data Center", Douglas Alger, May 2007, pp. 1-2.

* cited by examiner

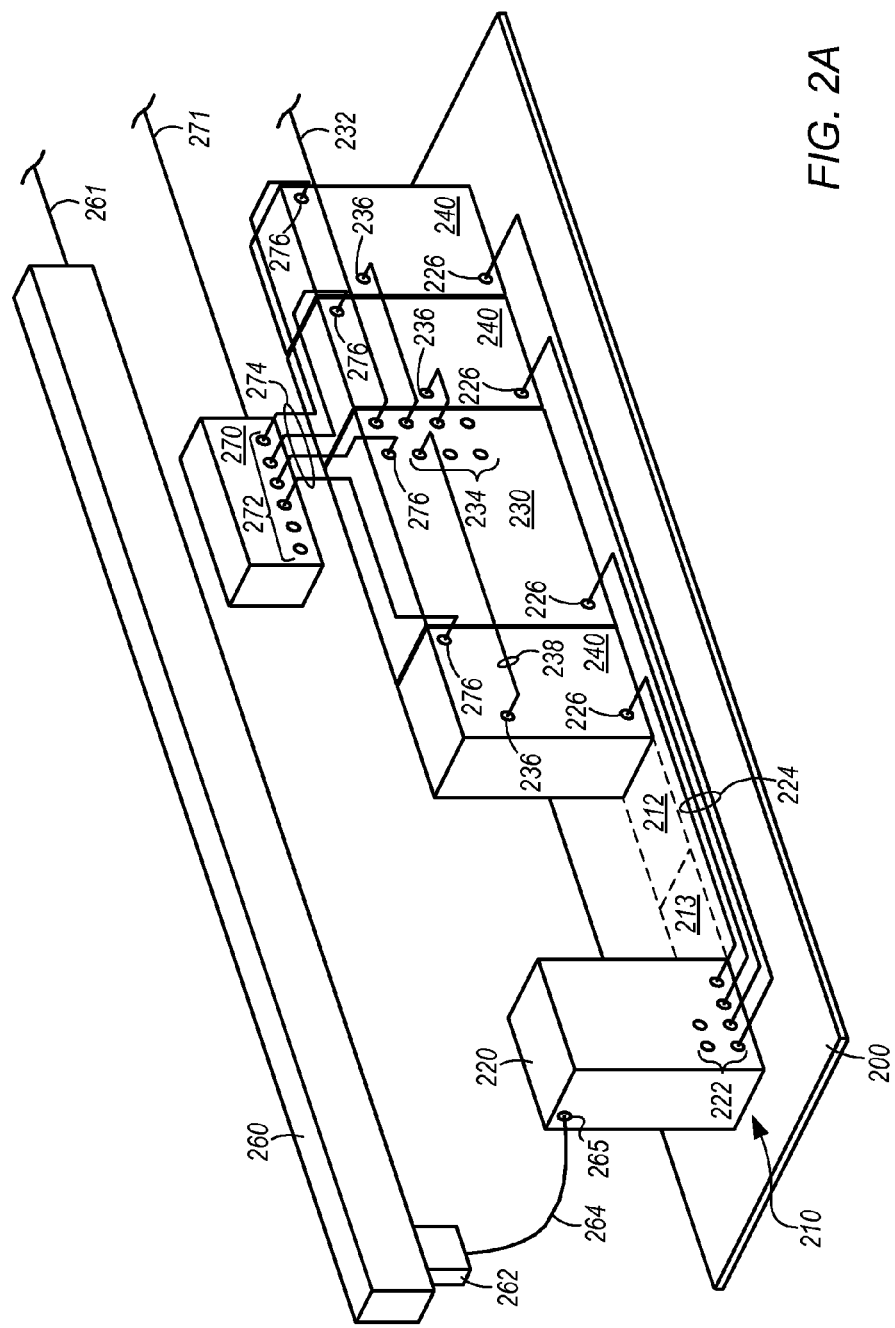

FLEXIBLE DATA CENTER RACK ALLOCATION

PRIORITY INFORMATION

This application claims benefit of priority to U.S. Provisional Patent Application No. 61/987,453, filed May 1, 2014 titled "DATA CENTER INFRASTRUCTURE," which is hereby incorporated by reference herein in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Because a computing facility may contain a large number of servers, a large amount of infrastructure may be required to support computing capacity of the data center. In particular, a large amount of cabling infrastructure equipment, electrical distribution infrastructure equipment, network communication infrastructure equipment, air cooling infrastructure equipment, etc. may be required to support computing operations by servers in a data center at any given time. Some instances of infrastructure are usually installed at initial construction of a data center, based at least in part upon design assumptions regarding the support requirements of server racks (also referred to herein as "rack computer systems") that are expected to be installed in the data center.

In some cases, where some or all infrastructure initially installed in a data center is based on expected support requirements of server racks which are expected to be installed in the data center, the server racks which are actually installed in a data center may differ in support requirements from the server racks upon which the infrastructure for a data center is originally designed. In addition, the support requirements of installed server racks may vary from rack to rack. Infrastructure which is designed based on expected support requirements of installed server racks may be at least partially restricted in supporting server racks that are actually installed.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to implement. Substantial time and resources are typically required to design and build a data center (or expansion thereof), install cabling infrastructure, install racks, structural support infrastructure, electrical distribution infrastructure, and cooling infrastructure, etc., to support changes in computing capacity. Additional time and resources are typically needed to conduct inspections and obtain certifications and approvals, such as for electrical and HVAC systems. Changes in computing capacity may result in changes in infrastructure support required to support the changed computing capacity. Installing infrastructure equipment, modifying infrastructure equipment, etc. may be time consuming and expensive, if even feasible. For example, where an installed server rack in a portion of a data center is replaced with another server rack, where the new server rack has substantially greater infrastructure support requirements, modifying the infrastructure which supported the previously-installed server rack may be difficult, particularly where the infrastructure to be modified lacks sufficient excess capacity to provide the needed support to the newly-installed server rack.

BRIEF DESCRIPTION OF THE DRAWINGS

FIG. 2A-C are schematic diagrams illustrating a perspective view of a data center in which rack computer systems are incrementally installed and connected to various infrastructure connections of various infrastructure modules, according to some embodiments.

Figure 1:
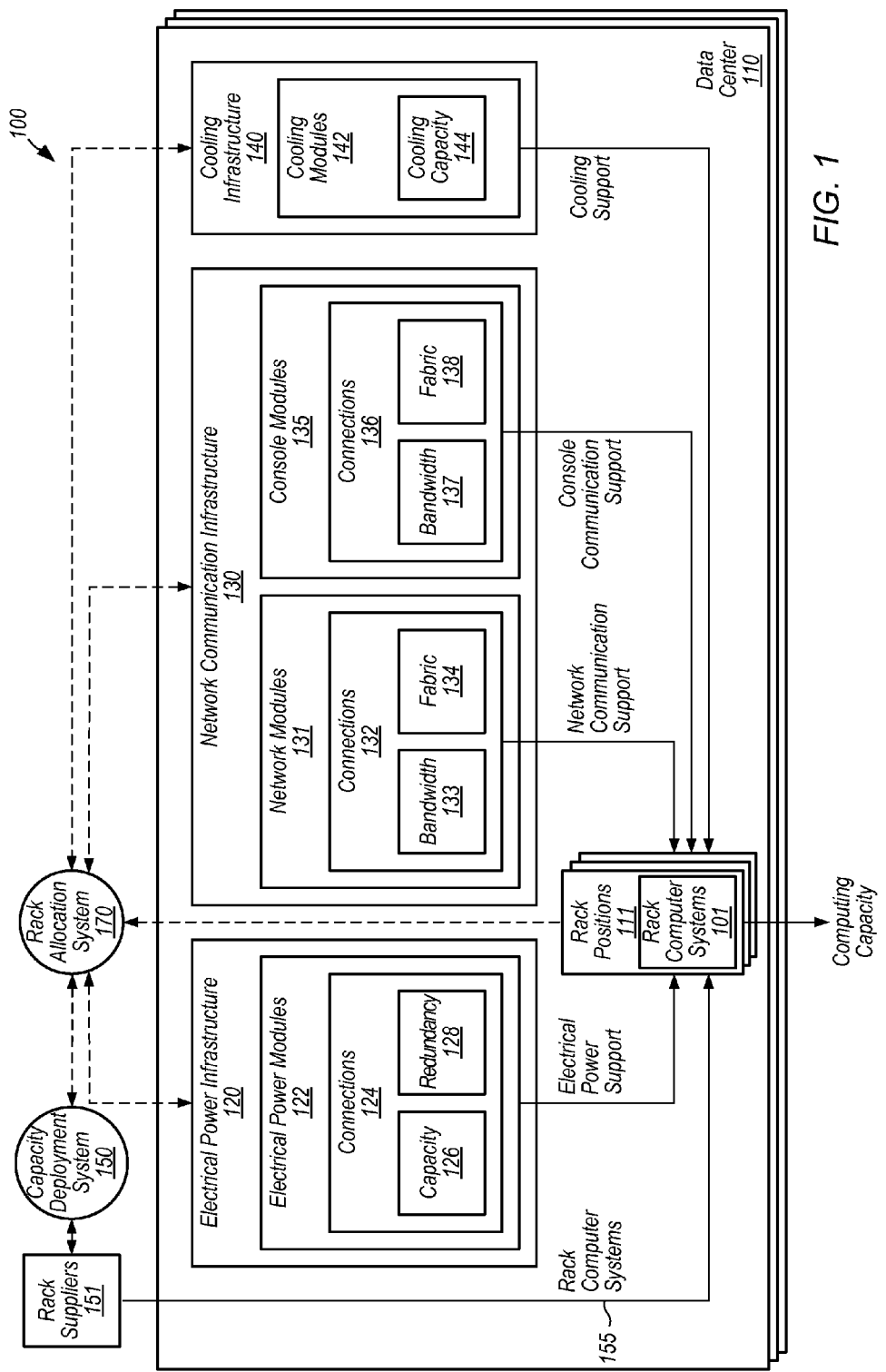
FIG. 1 is a schematic diagram illustrating a rack allocation system which incrementally allocates rack computer systems to particular rack positions in one or more data centers based at least in part upon a correlation of support requirements of the rack computer systems with infrastructure attributes associated with the rack positions, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a system and method for incrementally allocating rack computer systems to particular rack positions in one or more data center, based at least in part upon correlation of support requirements of the rack computer systems with infrastructure support attributes of the particular rack positions, are disclosed.

According to one embodiment, a data center includes a set of infrastructure modules, a set of rack positions configured to accommodate one or more rack computer systems, and a rack allocation system. Each infrastructure module includes sets of support connections and provides a particular capacity of a particular type of infrastructure support to one or more rack computer systems via the support connections. Some rack positions are unoccupied rack positions. The rack allocation system can associate the support connections, and the particular capacities of infrastructure support provided by same, with the unoccupied rack position as infrastructure support attributes of the unoccupied rack position. The rack allocation system can further allocate one or more inbound rack computer systems to the unoccupied rack position based at least in part upon a determination that a set of infrastructure support requirements associated with the one or more inbound rack computer systems correlates with the infrastructure support attributes of the unoccupied rack position.

According to one embodiment, a data center rack allocation system includes an infrastructure capacity module, rack position association module, and rack allocation module. The infrastructure capacity module communicates with infrastructure modules in at least one data center to identify, for each infrastructure module, an available infrastructure support connection which can connect with one or more rack computer systems and provide a particular capacity of a particular type of infrastructure support to the one or more rack computer systems. The rack position association module associates an unoccupied rack position in a data center with an available infrastructure support connection as an infrastructure support attribute of the at least one unoccupied rack position. The rack allocation module allocates a presently inbound rack computer system to be installed at the at least one unoccupied rack position in the data center, based at least in part upon a determination of a correlation between one or more infrastructure support requirements of the inbound rack computer system and the infrastructure support attribute associated with the at least one unoccupied rack position.

According to one embodiment, a method includes performing, by at least one computer system, incrementally allocating rack computer systems to rack positions in a data center. Such incrementally allocating includes associating a rack position with various available infrastructure support connections as infrastructure support attributes of the rack position, determining a set of infrastructure support requirements of a rack computer system, and allocating the rack computer system to be installed in a rack position based at least in part upon a determination that the set of infrastructure support requirements are met by the infrastructure support attributes of the rack position. The infrastructure support connections are each associated with one or more infrastructure modules and configured to provide one or more types of infrastructure support. The associating of support connections with a rack position is based at least in part upon communication with the infrastructure modules to identify the available infrastructure support connections associated with said infrastructure modules. The determination of infrastructure support requirements associated with the rack computer system is based at least in part upon a determination that the rack computer system is presently inbound to be installed in the data center.

As used herein, an "aisle" means a space next to one or more racks.

As used herein, "computing" includes any operations that can be performed by a computer, such as computation, data storage, data retrieval, or communications.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "room", "hall", etc. means a room, space, enclosure, etc. of a structure. A "computer room" means a room in which computer systems, such as rack-mounted servers, are operated.

As used herein, a "space", "enclosure", etc. means a space, area or volume.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, structure, container, etc. In some embodiments, a module is prefabricated at a location off-site from a data center.

In some embodiments, a data center is configured to install rack computer systems to provide computing capacity for the data center. The rack computer systems can be installed such that the rack computer systems are mounted in a particular position and are coupled to one or more of a power source and a communication network, via Just-In-Time (JIT) infrastructure that enables JIT installation of computing capacity and infrastructure in the data center.

As used herein, "Just-In-Time" (JIT) refers to a system where elements are provided to meet a demand concurrently with the manifestation of that demand. Under such a system, the elements are not provided in surplus or in advance of such manifestation of demand. Such a system can result in reduced inventory, reduced excesses in capacities, etc. As used herein, JIT installation can refer to installing an element concurrently with a determination of a need for the element to be installed to satisfy demand. Such demand for computing capacity can include presently-occurring demand. In some embodiments, such demand can include demand which is projected to be presently-occurring concurrently with the future installation of the element. For example, where installation of an element requires approximately 5 consecutive days of elapsed time to complete, JIT installation of the element can include installing a quantity of an element in response to a determination that demand that will occur in approximately 5 days' time will require the element to be installed to satisfy that demand. In some embodiments, a JIT installed element is not installed prior to such a determination. JIT installation of an element can include ordering the element to be delivered to a site for installation. As used herein, installation of elements, in amounts that correspond to the demand or need for such elements, may be referred to as "incremental" installation of such elements.

As an example of JIT installation of an element, JIT installation of computing capacity in a data center can refer to installing a certain number of rack computer systems which would provide a certain amount of computing capacity in a data center, concurrently with a determination that the certain amount of computing capacity will be required to satisfy demand for computing capacity at the data center which will occur approximately concurrently with the installation of the rack computer systems in the data center. In other words, JIT installation of rack computer systems can include installing rack computer systems in response to a determination that there is a need for such computing capacity to satisfy a demand for such computing capacity that will occur concurrently with installation of those rack computer systems. JIT installation of rack computer systems can include installing the rack computer systems in response to a determination that the above demand is presently-occurring. For example, where a data center is constructed to accommodate 20 rows of server racks and installation of such racks is determined to require 2 days of time, and five racks' worth of computing capacity is determined to be needed to satisfy computing capacity demand for the data center in approximately 2 days' time, five racks can be installed in the data center in response to such a determination. Additional racks can be installed, replaced, removed, etc. as the needed computing capacity changes over time.

In some embodiments, JIT installation refers to installing an element which is configured to support another element, concurrently with JIT installation of the other element. For example, JIT installation of infrastructure can include the infrastructure in a data center being installed incrementally and concurrently with installation of computing capacity in the data center, which can include JIT installation of computing capacity. Therefore, JIT infrastructure can be incrementally installed to support incremental installation of computing capacity in response to a determination that the incremental computing capacity is needed. In some embodiments, JIT infrastructure is installed subsequent to the above determination and concurrently with receipt and installation of the rack computer systems which provide the computing capacity at the data center.

Similarly to JIT installation of computing capacity, where the computing capacity installed is incremental and can provide an amount of computing capacity that satisfy the determined need for computing capacity, the JIT infrastructure can be installed incrementally and in a scale that corresponds to the incremental computing capacity being installed and which is to be supported by the JIT infrastructure. Similarly to the JIT installation of computing capacity being an installation of a minimally-sufficient amount of rack computer systems to provide the needed computing capacity, the JIT infrastructure installed can be a minimally-sufficient infrastructure to support the incremental computing capacity being installed. In some embodiments, JIT infrastructure is installed concurrently with the infrastructure being needed to support incremental changes in computing capacity in the data center, and not before the incremental change in computing capacity is determined to be needed. As a result, the infrastructure for a data center need not be installed upon initial completion of the data center, such that excess infrastructure is present immediately upon completion of the data center and remains unused in the data center until the needed computing capacity increases to utilize the excess infrastructure.

JIT infrastructure, in some embodiments, includes separate "sets" of "infrastructure modules" associated with each separate types of infrastructure support which supports computing operations in the data center. Various types of infrastructure support, as referred to herein, can include one or more of electrical power support, cooling support, network access support, console access support, etc. For each separate type of infrastructure, support of said type can be provided by one or more "sets" of infrastructure modules which each provide an incremental magnitude (also referred to interchangeably herein as an incremental "amount", "quantity", etc.) of the associated type of infrastructure support.

In some embodiments, each infrastructure module includes one or more sets of infrastructure support connections which can be coupled to one or more rack computer systems, via one or more instances of conduits and through which the infrastructure module can provide infrastructure support to the rack computer systems. For example, electrical power support can include incremental quantities of electrical power, and one or more power support redundancies thereof, provided by one or more branch circuit connections of one or more sets of electrical power modules, where each module is configured to provide a certain amount of electrical power, with a certain electrical power redundancy, via one or more branch circuit connections of the electrical power module. In another example, network communication support can be provided, in incremental amounts by one or more network ports of one or more network modules which can comprise one or more network switch devices, where each network switch device is configured to provide a certain amount of network communication bandwidth between a rack computer system and a communication network, via one or more network ports of the network switch device which are coupled to one or more network interfaces of the rack computer system via one or more communications conduits, including one or more instances of network communication cabling. In some embodiments, a particular network module provides network communication support associated with a particular network fabric via the network ports. In another example, console communication support can be provided, in incremental amounts by one or more console ports of one or more console modules which can comprise one or more console switch devices, where each console switch device is configured to provide a certain amount of console access bandwidth between a system console of a rack computer system and a communication network, via one or more console ports of the console switch device which are coupled to one or more system console interfaces of the rack computer system via one or more communications conduits, including one or more instances of network communication cabling. In some embodiments, a particular console module provides console communication support associated with a particular network fabric via the network ports. As used herein, a network fabric can refer to various fabrics as would be understood by one having ordinary skill in the art, including "switch fabric", etc. As used herein, network modules and console modules can be collectively referred to as "networking modules".

As used herein, providing infrastructure "support" refers to providing one or more types of infrastructure support to be available to support operations by one or more downstream systems and components, including one or more electrical loads, rack computer systems, etc. The type and magnitude of support provided by various infrastructure modules varies based at least in part upon the type of infrastructure support being provided by said modules. For example, an electrical power module which is configured to provide electrical power support to electrical loads in a data center can be configured to distribute an electrical power feed, having a certain magnitude of electrical power, to one or more downstream systems and components. An electrical power module may distribute electrical power directly to an electrical load via one or more power transmission lines, indirectly via one or more instances of power distribution infrastructure, busways, tap boxes, branch circuits, intermediate components including automatic transfer switch (ATS) assemblies, power distribution units, etc. In another example, one or more sets of air handling modules which are configured to provide cooling support in a data center include separate air moving devices which are each configured to induce a certain amount of airflow and are mounted in arrays to provide a certain amount of collective airflow of cooling air into the data center to remove heat from electrical loads installed in the data center. As noted above, network modules with associated infrastructure support connections can include one or more network switch devices with associated network ports, console modules with associated infrastructure support connections can include one or more console switch devices with associated console ports, etc.

In some embodiments, providing infrastructure "support" includes making a quantity of one or more certain types of infrastructure available for use by one or more electrical loads, although such available infrastructure may not be presently utilized at all times. For example, where an electrical power module provides electrical power support via providing an electrical power feed to one or more systems and components via one or more busways, power transmission lines, etc., such provided power feeds may be precluded from being received by the systems and components but may be made available for receipt based at least in part upon a positioning of one or more components upstream of the systems and components. For example, a reserve electrical power distribution module may provide reserve power support to an electrical load by providing a reserve power feed that can be selectively routed to the load by a transfer switch (which can be included in an ATS) that is downstream of the reserve power system and upstream of the load, where the transfer switch may selectively route the reserve power feed or a primary power feed to the load based at least in part upon one or more conditions associated with the primary power feed.

Conduits which couple a rack computer system with an infrastructure module via an infrastructure support connection of the infrastructure modulenetwork can include one or more instances of cabling. Cabling can include various instances of cabling which are installed and connected to infrastructure module connections and rack computer systems connections "Just in Time", concurrently with installation of a rack computer system in a data center, to support the rack computer system. For example, a patch cable connection which extends between a connection (also referred to herein as an "interface") of the rack computer system and an infrastructure support connection of a network module to establish a "direct patch cable connection" and is installed in the data center concurrently with installation of the rack computer system in the data center may be referred to as a just-in-time (JIT) direct patch cable connection between the rack computer system and the network module. Instances of cabling can include branch circuits, fiber optic cabling, copper cabling, bus trunk assemblies, power busways, etc. Such cabling can be coupled to one or more infrastructure support connections of one or more infrastructure modules and extended to one or more rack positions concurrently with the determination that the rack computer system is to be installed in the one or more rack positions to satisfy demand for computing capacity in the data center. Conduit connections between an infrastructure support connection of an infrastructure module and a rack computer system can be direct, such that one or more instances of cabling extend between the infrastructure module and rack computer system in series and independently of any intermediate devices, or indirect, such that one or more instances of cabling extend between the infrastructure module and rack computer system in series via one or more intermediate devices. Intermediate devices can include racks which include communication ports configured to communicatively couple one instance of cabling extending to an infrastructure module to another instance of cabling extending to the rack computer system.

In some embodiments, connecting a rack computer system installed in a rack position with various infrastructure modules via conduits which are incrementally installed concurrently with incremental installation of the rack computer system in the rack position enables incremental deployment of support infrastructure in a data center independently of prefabricated cabling assemblies, copper trunk assemblies etc. For example, a fiber optic cable connection, including a single-mode connection, multi-mode connection, etc. can be sufficient to enable communication between the rack computer systems in the row and the network, and fiber optic cables can be installed as needed (just-in-time), rather than being installed as an assembly prior to the capacity of the assembly being fully required in the data center, thereby mitigating waste. Furthermore, fiber optic cable connections between the network switch device in a row of rack computer systems and the network zone can be less than the cost of a copper trunk assembly extending from the network zone to one or more separate rows of rack computer systems or open rack positions.

Electrical power infrastructure, in some embodiments, includes one or more sets of electrical power modules which each provide a separate electrical power feed to provide a certain amount of electrical power support. Electrical power feeds from separate electrical power modules can be combined to provide a total electrical power feed in a data center.

For example, electrical power feeds distributed from each of several installed electrical power modules can be coupled to a common power busway assembly which extends at least partially through the data center, where the combined electrical power output of the installed electrical power modules can be distributed, via various electrical connections to the power busway assembly, to various electrical loads in the data center. Each electrical power module can include one or more sets of electrical power distribution components, including one or more utility transformers, backup power systems, switching devices, uninterruptible power supplies (UPSs), power distribution units (PDUs), etc. Each electrical power module can include the multiple components mounted in a common substructure to allow for a palletized or "skid" delivery and installation of the module as a single unit. Each electrical power module can have a form factor and can be assembled, tested, and commissioned at an off-site facility. Electrical power modules can each be mounted in assigned positions in the data center as a separate unit, and a power feed inlet and outlet connections can be established, to install the respective modules in the data center. Each electrical power module can be connected, at an inlet end, to one or more various power feeds, including a common utility power feed, one of multiple separate power feeds, etc. Each electrical power module can be connected, at an outlet end, to one or more various power line infrastructure modules, including one or more power busways, etc.

Cooling modules, in some embodiments, include one or more air handling modules configured to provide a flow rate of cooling air into a data center. Each air handling module can include one or more air moving devices, including a fan, blower, etc., which can induce a certain volumetric flowrate, mass flowrate, flow velocity, etc. of air. Cooling support provided by cooling modules can include one or more of the air flowrate induced by the one or more installed air handling. As a result, each air handling module can provide a portion of cooling support to each of the electrical loads in the data center.

As used herein, installing JIT infrastructure "concurrently" with installation of rack computer systems can refer to installing the infrastructure in response to a determination that the rack computer systems are to be installed. Such installation can occur after the determination and prior to the mounting of the rack computer systems in position in the data center, in response to the rack computer systems arriving at the data center, in response to the rack computer systems being mounted in position, etc.

As referred to herein, support "capacity" of installed infrastructure modules to provide a particular type of infrastructure support can be referred to as installed support capacity of the particular type of infrastructure support and can include a total capacity of one or more sets of infrastructure support connections included in one or more infrastructure modules to provide a certain type of infrastructure support. Support capacity for each type of infrastructure support (e.g., electrical power, power line distribution, cooling, networking, structural, etc.) can be monitored continuously.

FIG. 1 is a schematic diagram illustrating a rack allocation system which incrementally allocates rack computer systems to particular rack positions in one or more data centers based at least in part upon a correlation of support requirements of the rack computer systems with infrastructure attributes associated with the rack positions, according to some embodiments.

System 100 includes a set of data centers 110 which each include a set of rack positions 111 configured to accommodate one or more installed rack computer systems 101 which provide computing capacity via performing computing operations. Each data center 110 includes various sets of infrastructure 120-140 which each provide various types of infrastructure support to support computing operations by the rack computer systems 101 installed in the rack positions 111 of the respective data center 110.

Electrical power infrastructure 120 includes one or more infrastructure modules configured to provide electrical power support to rack computer systems 101 installed in the rack positions 111. Such infrastructure modules are referred to herein as "electrical power modules." Electrical power modules can each receive an inlet power feed, including a utility power feed from a utility power source, and can distribute an electrical power feed via an outlet connection. Each separate electrical power module 122 can provide a certain amount of electrical power to the rack computer systems 101, and the various electrical loads installed in data center 110. Each separate electrical power module 122 includes one or more infrastructure support connections 124 which are configured to be electrically coupled to the rack computer systems 101 via one or more conduits which connect the connections 124 with a set of connections in the rack computer systems. Such connections 124 can be referred to herein as electrical power connections, power inlets, power outlets, etc. Each set of electrical power connections 124 is configured to provide a certain magnitude of electrical power; such a magnitude can be referred to as the electrical power support capacity 126 of the connection. In addition, a given electrical power module 122, and thus one or more connections 124 thereof, can provide a certain power support redundancy 128 to rack computer systems to which the module 122 is coupled and is configured to provide electrical power. Such redundancies which can be supported by an electrical power module 122 will be understood to encompass one or more of the various power support redundancies known to those having ordinary skill in the art, including N redundancy, 2N redundancy, N+1 redundancy, etc. As will be further understood, the electrical power support capacity 126 of an electrical power connection 124, the electrical power support redundancy 128 of the module 122 and connections 124 included therein, etc. can be referred to as infrastructure support "attributes" of the various connections 124 included in the electrical power module 122.

Network communication infrastructure 130 includes one or more network communication infrastructure modules 131, also referred to herein as "network modules", which provide incremental network communication support to the rack computer systems 101 installed in the data center 110, and console communication infrastructure modules 135, also referred to herein as "console modules", which provide incremental console communication support to the rack computer systems 101. Network modules 131 can include one or more network switch devices, one or more router devices, including one or more master routers, etc. As shown, a network module 131 can include one or more infrastructure support connections 132, which can comprise one or more network ports, which are configured to provide a certain amount of communication bandwidth 133, also referred to herein as bandwidth capacity of the connections 132. In addition, each network module 131, and the connections 132 included therein, can be associated with a particular network fabric 134. Network modules can communicatively couple one or more rack computer systems 101 to one or more communication networks, via communicative coupling of the rack computer systems with one or more network ports 132 via one or more communication conduits, which can include one or more various types of network communication cabling, patch cabling, fiber optic cabling, copper cabling, etc. Console modules 135 can include one or more console switch devices, one or more router devices, including one or more master routers, etc. As shown, a console module 135 can include one or more infrastructure support connections 136, which can comprise one or more console ports, which are configured to provide a certain amount of communication bandwidth 137, also referred to herein as bandwidth capacity of the connections 136. In addition, each console module 135, and the connections 136 included therein, can be associated with a particular console fabric 138. Console modules can enable remote access to one or more system consoles of the one or more rack computer systems 101, via communicative coupling of the rack computer systems with one or more console ports 136 via one or more communication conduits, which can include one or more various types of console communication cabling, patch cabling, fiber optic cabling, copper cabling, etc.

Cooling infrastructure 140 includes one or more cooling modules 142, also referred to herein as air handling modules, which each are configured to provide incremental cooling support to the rack computer systems 101. Cooling modules 142 can each induce a certain amount of cooling air flow into a data center. Such amount of cooling airflow which a cooling module is configured to induce can be referred to as the cooling capacity 144 of the cooling module 142. For example, a cooling module 142 can include one or more air moving devices configured to induce a certain air flow rate into the data center. The air flow can be cooled by one or more air cooling systems included in the one or more cooling modules 142.

Computing capacity deployment system 150 can be implemented by one or more computer systems and is configured to command delivery of one or more rack computer systems 155, from one or more suppliers 151, to one or more data centers 110 for installation in one or more rack positions 111 therein. System 150 can command such delivery based at least in part upon monitoring computing capacity provided by the installed rack computer systems 101 and a determination that additional computing capacity is required. A certain quantity of rack computer systems 155 which are configured to provide at least a certain amount of additional computing capacity, which can at least meet a required additional amount of computing capacity, can be selected and commanded to be delivered by one or more suppliers. Suppliers 151 can include one or more vendors of rack computer systems 155, one or more inventory storage facilities, etc.

Rack allocation system 170 can be implemented by one or more computer systems and is configured to allocate one or more rack computer systems 155, which are ordered and presently inbound for delivery to one or more data centers 110, to one or more particular rack positions 111 within the respective data centers 110. System 170 can monitor the various infrastructure modules 120-140 included in the data centers 110, including various connections and attributes associated therewith, and can further monitor which rack positions 111 are unoccupied, associate various infrastructure support connections, attributes associated therewith, etc. with the rack positions as attributes of said rack positions, and allocate particular rack computer systems 155 to particular rack positions 111 based at least in part upon a correlation between the infrastructure support requirements, also referred to herein as support requirements, of the rack computer systems 155 with the infrastructure support attributes of one or more of the rack positions 111 in a destination data center. System 170 can also allocate particular infrastructure support connections 122, 132, 136 to be connected to the rack computer systems 155 upon installation of the rack computer systems 155 in the allocated rack positions 111.

In some embodiments, system 170 can monitor various infrastructure modules, connections included therein, etc. to verify, subsequently to installing one or more allocated rack computer systems 155 in a data center 110, whether the rack computer systems 155 were installed and connected according to the allocation of same. If not, system 170 can command that the rack computer systems 155 be reinstalled, reconnected, etc. according to the allocation plan for said rack computer system 155. In some embodiments, system 170 is implemented by one or more computer systems which are communicatively coupled to one or more of the infrastructure modules included in one or more data centers. As a result, system 170 can be configured to communicate with said infrastructure modules to access information associated with said infrastructure modules, including information indicating one or more of availability of infrastructure support connections included in said modules, capacities associated with said modules, capacities associated with said connections, some combination thereof, etc. In the illustrated embodiment of FIG. 1, for example, system 170 is shown to be communicatively coupled with the various instances of electrical power infrastructure 120, network communication infrastructure 130, and cooling infrastructure 140 via one or more various communication pathways, which can include one or more network communication links. In some embodiments, system 170 is communicatively coupled to one or more of a building management system (BMS) of one or more data centers and is configured to access the BMS to access information associated with one or more elements of one or more data centers.

Figure 2B:
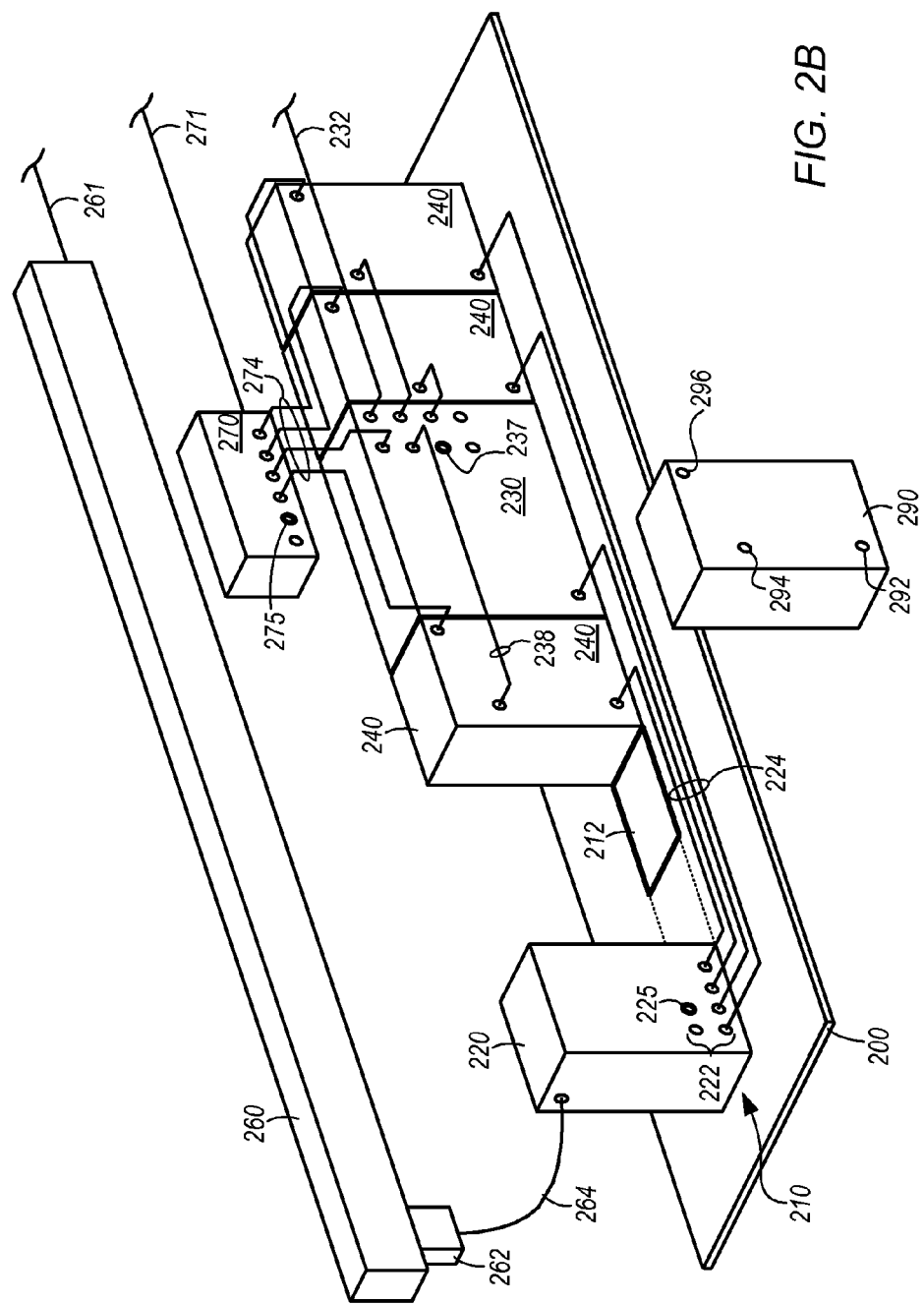
Figure 2C:
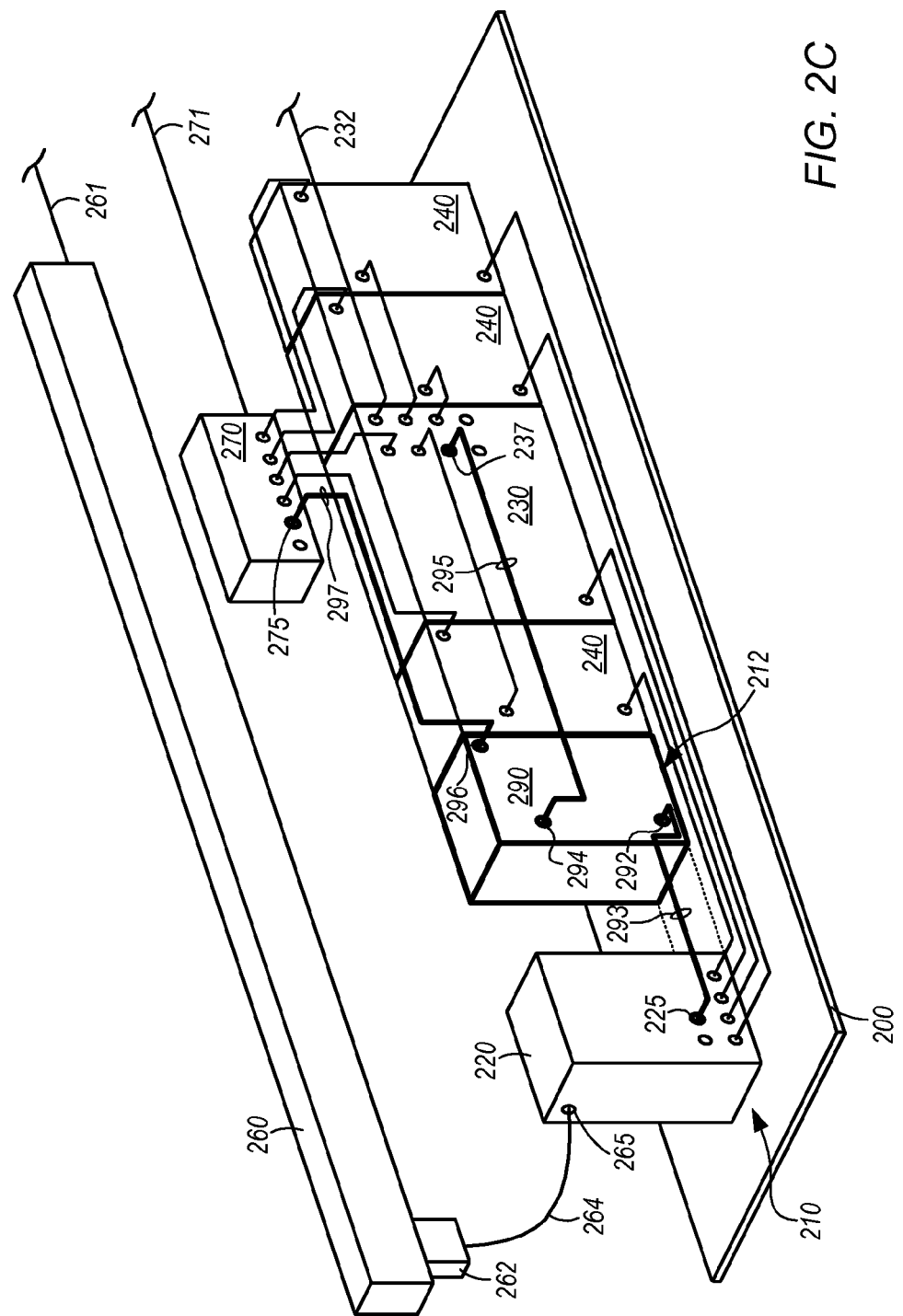

FIG. 2A-C are schematic diagrams illustrating a perspective view of a data center in which rack computer systems are incrementally installed and connected to various infrastructure connections of various infrastructure modules, according to some embodiments. The various elements illustrated in FIG. 2A-C can be included in some or all of the system illustrated in FIG. 1.

Data center 200 includes a row 210 of rack positions, where at least some rack positions are occupied by one or more instances of equipment, rack computer systems, network switch devices, electrical power components, some combination thereof, etc. The row 210 can extend in parallel with an aisle space, and the aisle space can extend in parallel with multiple rows adjacent to multiple separate sides of the aisle. Data center 200 also includes various conduits which couple various components, rack computer systems, etc. installed in a rack position to electrical power support, network communication support, console communication support, some combination thereof, etc.

FIG. 2A-C illustrates data center 200 in a state where row 210 includes occupied rack positions and at least some unoccupied rack positions. For example, in FIG. 2A, the row 210 of rack positions includes an automatic transfer switch (ATS) assembly 220, a network switch device 230, and three rack computer systems 240 installed in "occupied" rack positions in the row 210, while rack positions 212, 213 are unoccupied.

In some embodiments, a data center comprises various instances of infrastructure support configured to provide various types of infrastructure support, to one or more rack computer systems in the data center, to support computing operations by the various rack computer systems. Such types of infrastructure support can include electrical power support, network communication support, and console communication support. Such support can be provided via particular interfaces, also referred to as "connections", in various infrastructure modules installed in the data center. In the illustrated embodiments of FIG. 2A-C, for example, data center 200 includes an ATS assembly 220 configured to distribute electrical power received from an electrical power source 261 to provide electrical power support to various instances of equipment installed in row 210, a network switch 230 configured to communicatively couple one or more instances of equipment installed in row 210 to one or more communication networks via one or more conduits 232 to provide network communication support to said instances of equipment, and a console switch device 270 configured to communicatively couple system consoles of the one or more instances of equipment to one or more communication networks via one or more conduits 271 to provide console communication support to said instances of equipment. In some embodiments, ATS assembly 220 includes one or more ATS switching devices, where each of the ATS switching devices is configured to receive electrical power from multiple separate connections 265 of the assembly 220 and selectively distribute electrical power received via one of the connections 265 to one or more connections 222.

In the illustrated embodiment, console switch device 270 is shown to not be installed in any particular rack position in row 210, but is rather illustrated to be installed in an elevated position which is located above rack computer systems 240, ATS assembly 220, and network switch device 240. It will be understood that, in some embodiments, console switch 270 is installed on one or more instances of structural support infrastructure, including a cable tray structure, scaffold, support structure, etc., which extend above the instances of equipment installed in the rack positions of the row 210. In some embodiments, the console switch device 270 is installed in one or more rack positions in row 210, in one or more instance of equipment installed in one or more such rack positions, etc.

Each infrastructure module 220, 230, 270 can be connected, via a particular set of connections and conduits, to various instances of equipment installed in row 210 to provide the corresponding type of infrastructure support for the respective module. For example, ATS assembly 220 includes a power inlet connection 265 which is electrically coupled to an electrical power conduit carrying power from one or more electrical power sources 261. In the illustrated embodiment, connection 265 is connected to an electrical power busway 260, which can extend along a portion of row 210 and is configured to carry electrical power from an electrical power source 261, via a tap box 262 and electrical power cabling 264 connection. The ATS assembly 220 includes a set of power outlet connections 222, where each individual connection 222 can be coupled to a corresponding electrical power connection 226 of a separate instance of equipment installed in the row 210, including rack computer systems 240 and network switch device 230, via individual branch circuits 224 which can include electrical power cabling. Network switch device 230 is communicatively coupled to a communication network via a communication conduit 232 which can include one or more instances of network communication cabling, and network switch device 230 includes a set of network communication connections 234, also referred to herein as "network ports", which are each configured to be coupled to a separate connection 236 of a separate rack computer system 240, via a separate communication conduit 238 which can include one or more instances of network communication cabling, patch cabling, etc., so that network switch device 230 provides network communication support to track computer systems 240 installed in the row 210 via the various network ports 234. Console switch device 270 is communicatively coupled to a communication network via a communication conduit 271 which can include one or more instances of network communication cabling, and console switch device 270 includes a set of console communication connections 272, also referred to herein as "console ports", which are each configured to be coupled to a separate connection 276 of a separate rack computer system 240, network switch device 230, etc., via a separate communication conduit 274 which can include one or more instances of network communication cabling, patch cabling, etc., so that console switch device 270 provides console communication support to rack computer systems 240, network switch devices 230, etc. installed in the row 210 via the various console ports 272.

In some embodiments, certain infrastructure support connections included in various infrastructure modules, referred to herein as "available" infrastructure support connections, are not connected to any instances of equipment, and therefore are not presently providing infrastructure support to any such instances. In the illustrated embodiment, for example, the ATS assembly 220, network switch device 230, and console switch device 270 each include available infrastructure connections in each of the respective sets of connections 222, 234, 272 of the respective modules 220, 230, 270.

In some embodiments, various combinations of infrastructure connections included in various infrastructure modules can be associated with rack positions in one or more rows associated with the infrastructure modules in which the various infrastructure connections are included. In the illustrated embodiment, for example, one or more of modules 270, 230, 222, one or more of the infrastructure connections 222, 234, 272 included therein, etc. are associated with one or more rack positions in row 210, including rack positions 212, 213. Each infrastructure connection can be associated with various infrastructure support attributes associated with the infrastructure support which can be provided to instances of equipment via connection with the respective infrastructure connection. Such infrastructure support attributes of each infrastructure connection which it itself associated with a rack position, are thus associated with the rack position as part of the infrastructure support attributes of the rack position. Thus, each rack position can be associated with various attributes which indicate various types of infrastructure support available to be provided to instances of equipment installed in the rack position, where types of available infrastructure support have various attributes and available via connection with various particular infrastructure connections of various particular infrastructure modules. For example, rack position 212 can be associated with a set of infrastructure support attributes which includes certain magnitudes of electrical power support available via connection to the two available connections 222 of the ATS assembly, where the connections 222 are configured to connect with one or more particular types of conduits 224. In addition, the set of infrastructure support attributes associated with rack position 212 can include an indication of a certain number of network switch devices 230, available network ports 234 thereon, conduit types 238 for connection thereto, and one or more various fabric, bandwidth, etc. which can be provided via the various connections 234. In addition, the set of infrastructure support attributes associated with rack position 212 can include an indication of a certain number of console switch devices 270, available network ports 272 thereon, conduit types 274 for connection thereto, and one or more various fabric, bandwidth, etc. which can be provided via the various connections 272. Based at least in part upon the various attributes associated with a given rack position, a determination can be made whether a particular instance of equipment, which can have a set of support requirements of infrastructure support required to support operations by the instance of equipment, can be supported if installed in the rack position.

As noted above, FIG. 2A illustrates a data center where row 210 includes at least two unoccupied rack positions 212, 213, and one or more rack positions is associated with one or more sets of infrastructure support attributes based at least in part upon the various modules 220, 230, 270 and connections therein 222, 230, 270 which are associated with the rack positions 212, 213. The various modules, connections therein, etc. can be associated with a rack position based at least in part upon physical proximity thereto. For example, connections in ATS assembly 220, network switch device 230, console switch device 270, etc., and the various infrastructure support attributes, also referred to interchangeably herein as "attributes", of the individual modules, connections, etc., can be associated with a rack position based at least in part upon the modules 220, 230, 270 being installed in one or more rack positions in a common row with the rack position, installed within a certain proximity to the row 210, installed within a certain proximity to a particular rack position, installed in a position which is within a certain physical proximity to the rack position, some combination thereof, etc. For example, connections 222, 234 of modules 220, 230 can be associated with rack positions 212, 213 based at least in part upon modules 220, 230 being installed in rack positions in a common row with rack positions 212, 213. In another example, connections 272 of module 270 can be associated with rack positions 212, 213 based at least in part upon physical proximity of console switch device 270 to the rack positions 212, 213, to network switch device 230, to row 210, some combination thereof, etc.

In some embodiments, where one or more rack computer systems are to be installed in a rack position in a data center, the one or more rack computer systems can each be assigned to a particular rack position based at least in part upon a determination that the support requirements associated with the respective rack computer system correlate with the infrastructure support attributes of the particular rack position. In some embodiments, where the correlation is based at least in part upon correlation of infrastructure support attributes of particular infrastructure connections of particular infrastructure modules with particular support requirements of the rack computer system, the particular infrastructure connections can be assigned, reserved, etc. for connection to the rack computer system via one or more instances of conduits.

FIG. 2B illustrates a rack computer systems 290 which is to be installed in data center 200 and is assigned to a particular unoccupied rack position 212 based at least in part upon a determination of a correlation, which can refer to a match within one or more margins, of a set of infrastructure support requirements of the rack computer system 290 with at least some of the infrastructure support attributes associated with the rack position 212. The rack computer system 290 can include a rack computer system which has been ordered for delivery to data center 200 and is presently inbound for delivery to data center 200. While not presently located at data center 200, the presently inbound rack computer system 290 can be presently in transit to the data center via one or more modes of transportation, including one or more delivery trucks, aircraft, watercraft, etc.

In some embodiments, the infrastructure support attributes associated with rack position 212 are associated with the various infrastructure support attributes of the various connections 222, 234, 272 of modules 220, 230, 270. A determined correlation can include determining a correlation between at least some support requirements of the rack computer system 290 with infrastructure support attributes associated with one or more particular infrastructure connections included in the infrastructure support attributes of the rack position 212. For example, the correlation of rack computer system 290 with rack position 212 can include a determination that the electrical power support requirements of rack computer system 290, including electrical power requirements (e.g., 20 KVa), conduit type, etc., are at least met via electrical power support available via connection to at least one of the available connections 222 of module 220, including available connection 225. In another example, the correlation of rack computer system 290 with rack position 212 can include a determination that the network communication support requirements of rack computer system 290, including network port requirements (e.g., one switch and one network port), fabric, bandwidth (e.g., 10 MB/sec per network port), etc., are at least met via network communication support available via connection to at least one of the available network ports 234 of module 230, including available network port 237. In another example, the correlation of rack computer system 290 with rack position 212 can include a determination that the console communication support requirements of rack computer system 290, including console port requirements (e.g., one switch and one console port), fabric, bandwidth (e.g., 10 MB/sec per network port), etc., are at least met via console communication support available via connection to at least one of the available console ports 272 of module 272, including available console port 275.

As shown in FIG. 2B, the assignment of rack computer system 290 to a particular rack position 212, based at least in part upon correlation of the infrastructure support requirements of the rack computer system 290 with at least some infrastructure support attributes of rack position 212, can include assignment of various connections of the rack computer system 290 to connect with various particular infrastructure support connections of various infrastructure modules, based at least in part upon correlation of at least some support requirements of the rack computer system 290 with the infrastructure support attributes associated with the various particular infrastructure support connections. For example, in the illustrated embodiment of FIG. 2B, rack computer system 290 is assigned to electrical power connection 225, network port 237, and console port 275, so that, upon installation in rack position 290, the electrical power connection 292, network connection 294, and console connection 296 of the rack computer system 290 are assigned to be connected with the respective electrical power connection 225, network port 237, and console port 275, via various conduits, so that computing operations by the rack computer system 290 are supported by the infrastructure of data center 200.

In some embodiments, the above correlating and assigning of a rack computer system to one or more particular rack positions, infrastructure support connections, etc. is based at least in part upon a determination that the rack computer system is presently inbound for delivery to the particular data center 200. Because the rack computer system 290 is presently inbound, the support requirements of a rack computer system which is to be assigned to one or more rack positions in the data center can be determined, as the particular rack computer system which is presently inbound can have a particular set of support requirements. The set of support requirements can be predetermined, such that the support requirements used in the above correlation and assignment are identified based at least in part upon a notification that a particular model of rack computer system is presently inbound, and accessing a database of support requirements associated with various rack computer system models in response to identify the particular set of support requirements of the inbound rack computer system. In some embodiments, the particular support requirements of the inbound rack computer system can be included with a received notification that the rack computer system is inbound.

In some embodiments, assigning various connections 292, 294, 296 of a rack computer system 290 to be connected with particular infrastructure support connections 225, 237, 275 includes identifying particular instances of conduits to connect to each pair of connections 292, 225; 294, 237; 296, 275 and extend there between. The particular instance of conduit can be based at least in part upon conduit types (e.g., a particular type of cabling, including a particular type of Ethernet cabling, a particular connector configuration, including RJ45, etc.), a physical distance between the pair of connections, known instance of conduits which are available for connection to the connection pairs, etc.

As shown in FIG. 2C, upon installation in the particular rack position 212 to which the rack computer system 290 is assigned, the rack computer system 290 is connected to the assigned infrastructure support connections 225, 237, 275 via respective instances of support conduits 293, 295, 297 extended between the respective infrastructure support connections 25, 237, 275 and corresponding connections 292, 294, 296 configured to couple with said infrastructure support connections and receive the infrastructure support which said infrastructure support connections are configured to provide.

Some instances of equipment are installed in a single rack position; in the illustrated embodiment, for example, ATS assembly 220 and rack computer systems 240 are each installed in separate individual rack positions. In some embodiments, multiple rack positions are occupied by a single installed instance of equipment. For example, in the illustrated embodiments of FIG. 2A-C, network switch device 230 is installed in two adjacent rack positions.

Figure 3:
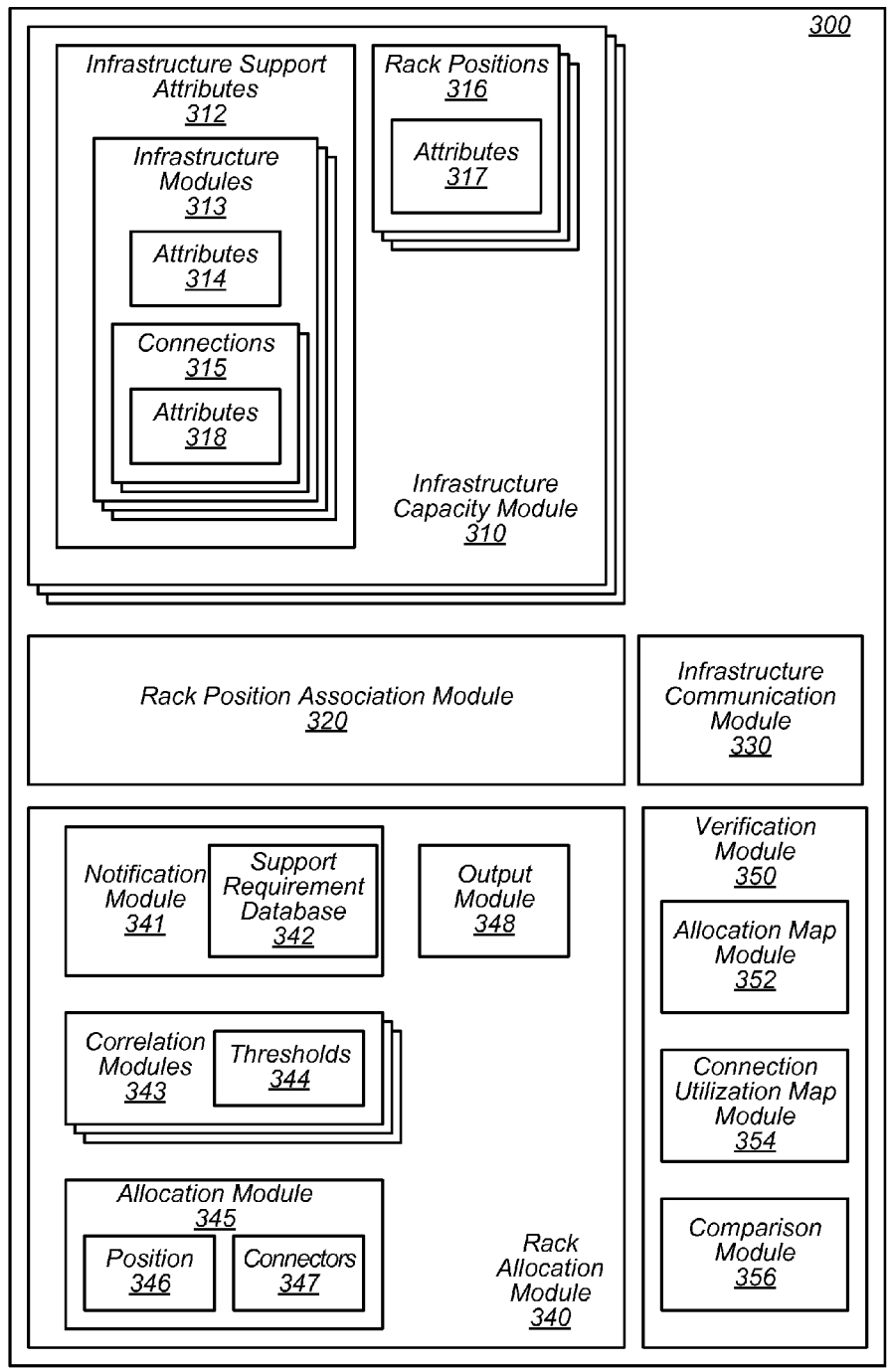
FIG. 3 illustrates a schematic block diagram of a rack allocation system, according to some embodiments.

FIG. 3 illustrates a schematic block diagram of a rack allocation system, according to some embodiments. The rack allocation system, which can be at least partially included in the rack allocation system illustrated in FIG. 1, can be implemented by some or all of one or more computer systems, including the computer system illustrated in FIG. 7.

Rack allocation system 300 includes an infrastructure capacity module 310 which is configured to track various infrastructure support attributes associated with various infrastructure modules included in various data centers, and infrastructure support connections included therein, as well as track various rack positions, included in various data centers. Infrastructure capacity module 310 includes an Infrastructure support attribute module 312 which is configured to identify and track attributes associated with various infrastructure modules installed in one or more data centers. For example, as shown, the module 312 can maintain a database of various infrastructure modules 313. Each infrastructure module can be installed in one of one or more data centers monitored by system 300. For each infrastructure module, module 312 is configured to track various attributes associated with the infrastructure module, including infrastructure support connections included in the infrastructure module, various attributes associated with each infrastructure support connection, various attributes associated with the infrastructure module as a whole, etc. For example, as shown, module 312 can track attributes 314 associated with an infrastructure module in general. Such attributes can be included as attributes of each of the infrastructure support connections included in the infrastructure module, and can include attributes including an indicator of a particular data center in which the infrastructure module is located, a physical location of the infrastructure module in the data center, a particular fabric associated with the infrastructure module, etc. As further shown, module 312 can track individual sets of infrastructure support connections 315 included in an infrastructure module and can track attributes 318 associated with a given connection 315. Such attributes 318 can be specific to a particular connection 315, including an indicator of a particular type of conduit (e.g., a particular type of fiber optic cabling, a particular type of network cabling, etc.) to which the connection is configured to be engaged, a particular support capacity of infrastructure support which the connection is configured to provide (e.g., 15 KVa electrical power, 10 MB/s bandwidth, etc.), whether the connection is currently connected to a rack computer system or is "available" for connection, etc. As noted above, attributes associated with an infrastructure module in general can be included in attributes of each of the connections included therein. As a result, attributes 314 can be included in each set of attributes 318 of each set of connections 315 included in the module 313.

In some embodiments, module 312 can track changes to various infrastructure modules, connections included therein, and attributes thereof, over time. Such tracking can be based at least in part upon communication with such infrastructure modules, connections included therein, etc. For example, in the illustrated embodiment, system 300 includes a communication module 330 configured to communicate with one or more remote devices, which can include one or more infrastructure modules, rack computer systems, etc., to identify infrastructure modules 313 installed in or more data centers, identify connections 315 included in the infrastructure modules, and identify various attributes associated with one or more of the infrastructure module 314 and connections 318. Such communication can include communicating with the infrastructure modules directly via a communication network to access infrastructure support data which can include information identifying one or more various infrastructure modules, included infrastructure support connections, and associated attributes.

Infrastructure capacity module 310 includes a rack position tracking module 316 which is configured to track rack positions included in one or more data centers, including various infrastructure support attributes associated with the rack positions. Such attributes can be stored in one or more databases. As shown at 317, tracking module 316 can track various infrastructure support attributes associated with the rack position. Such attributes can include physical aspects associated with the rack position, including an indicator of the particular data center in which the rack position is located, and the physical location therein. Such attributes can include an indicator of whether the rack position is occupied by one or more instances of equipment, rack computer systems, infrastructure modules, etc., whether the rack position is "unoccupied" and therefore is configured to accommodate installation of various elements in the rack position, whether the rack position is presently configured to receive one or more types of infrastructure support (e.g., whether the rack position is "energized"), some combination thereof, etc. Such attributes can include, for one or more rack positions, attributes associated with one or more infrastructure modules, infrastructure support connections, etc. which are associated with the respective rack position. Module 316 can track the various rack positions in various data centers, as well as attributes associated with each rack position, based at least in part upon communication with one or more remote devices to access data associated with one or more rack positions. For example, system 300 can communicate with one or more remote systems, via module 330, to identify various rack positions 316 in one or more data centers, various associated attributes 317 thereof, etc.

System 300 includes a rack position association module 320 which is configured to associate one or more attributes associated with one or more infrastructure modules, infrastructure support connections included therein, etc. with one or more rack positions as infrastructure support attributes of the one or more rack positions. Module 320 can associate such attributes based at least in part upon associating one or more infrastructure modules, one or more sets of infrastructure connections included therein, etc. with the rack position module, which can include associating various attributes associated with such infrastructure modules and connections as a result. Infrastructure modules, infrastructure support connections, etc. can be associated with one or more rack positions based at least in part upon a determined correlation between one or more sets of corresponding attributes associated with each of the Infrastructure modules, infrastructure support connections, etc. and the one or more rack positions. In some embodiments, such a set of corresponding attributes between an infrastructure support connection and a rack position, based upon which the connection can be associated with the rack position as an infrastructure support attribute thereof, can include an indicator of whether the respective connection or rack position is currently available or unoccupied. For example, where a rack position is unoccupied, an available infrastructure support connection may be associated with the rack position based at least in part upon the connection being available for connection. In some embodiments, such a set of corresponding attributes between an infrastructure support connection and a rack position, based upon which the connection can be associated with the rack position as an infrastructure support attribute thereof, can include an indicator of the physical distance between the respective connection and the rack position, which can be determined based at least in part upon a comparison of the respective physical locations of the connections and the rack position. Where the physical distance is determined to be less than a certain threshold, the connections can be determined to be "proximate" to the rack position and therefore associated with the rack position as infrastructure support attributes thereof.

In some embodiments, one or more infrastructure modules, infrastructure support connections, etc. are determined to be "proximate" to a rack position based at least in part upon determined similarities in the respective physical locations of same in a data center. For example, where an infrastructure module is determined to be located in a common row of rack positions as a given rack position, the infrastructure module, and one or more sets of infrastructure support connections included therein, can be determined to be "proximate" to the given rack position and therefore associated with the rack position as infrastructure support attributes of same. When one or more infrastructure modules, infrastructure support connections, etc. are associated with a rack position, the infrastructure modules, infrastructure support connections, attributes associated with same, some combination thereof, or the like can be included in the tracked attributes 317 of the tracked rack position 316.

Rack allocation system 300 includes a rack allocation module 340 which is configured to allocate rack computer systems to various rack positions, infrastructure support connections, etc. in one or more data centers based at least in part upon correlations between support requirements of the rack computer systems and infrastructure support attributes associated with the rack positions. Module 340 includes a notification module 341 which is configured to determine that one or more particular rack computer systems are presently inbound for delivery to one or more particular data centers. Module 341 may make such a determination based at least in part upon a receipt of a notification that the one or more rack computer systems are inbound, which can include an indication that one or more rack computer systems have been ordered for delivery, an indication of a destination data center of each of the rack computer systems, an estimated delivery date of each of the rack computer systems, a manufacturer and model of each of the rack computer systems, some combination thereof, etc.

In some embodiments, module 341 is configured to determine, for each inbound rack computer system, a particular set of support requirements associated with the given rack computer system. Such support requirements can be included, at least partially, in the received notification which indicates that the given rack computer system is inbound for delivery to a data center. In some embodiments, module 341 includes a support requirement database 342 which stores entries which indicate, for each given particular model of rack computer system, various support requirements of that particular model of rack computer system. As a result, in some embodiments, module 341 can respond to a notification indicating that a particular model of rack computer system is inbound for delivery to a particular data center by accessing database 342 to identify a set of support requirements associated with the inbound rack computer system.

Module 340 includes one or more correlation modules 343 which are each configured to identify, for each rack computer system that is inbound for delivery to a particular data center and has an associated set of support requirements, one or more particular unoccupied rack positions in the particular data center which have a set of infrastructure support attributes which correlate with the support requirements of the rack computer system. To implement such correlation, module 343 can utilize data from module 341, including identified support requirements of the rack computer system, and data from one or more of modules 312, 316, including various attributes of one or more rack positions which correspond to one or more particular support requirements of the rack computer system.

Module 343 can include a set of modules 343 which are each configured to compare corresponding sets of attributes and support requirements. A given corresponding set can be associated with a particular aspect of infrastructure support. For example, one corresponding set of attributes and support requirements which can be compared can include a network fabric; a quantity of ports in a set of ports, a magnitude of electrical power, a power support redundancy, a conduit type to which a particular connection is configured to engage, a bandwidth capacity, some combination thereof, etc. Each of modules 343 can compare a given support requirement of a rack computer system with the corresponding infrastructure support attributes of each of the rack positions included in a data center to identify a candidate set of rack positions which correlate with at least the given support requirement.

In some embodiments, for one or more sets of corresponding support requirements and attributes, a given module 343 can determine that the corresponding support requirement of a rack computer system and infrastructure support attributes correlate if correlating within a certain threshold 344. For example, if the bandwidth capacity of a network port included in a network switch device is within 5% of the network bandwidth requirement of a rack computer system, a module 343 may determine that the bandwidth capacity of a network port correlates with the network bandwidth requirement of the rack computer system.

Module 340 includes an allocation module 345 which is configured to allocate one or more rack computer systems to one or more particular rack positions, infrastructure support connections, etc., based at least in part upon the one or more correlations of support requirements of the rack computer systems with various attributes associated with the rack positions. Where multiple modules 343 each establish a separate set of candidate rack positions associated with one or more infrastructure support attributes which correlate with one or more particular support requirements, module 345 identifies one or more correlating rack positions included in each of the sets of candidate rack positions. From the one or more correlating rack positions, module 345 includes a sub module 346 which selects a particular rack position to which to allocate the rack computer system. Such an allocation of the rack computer system to a rack position can "reserve" the rack position for installation of the rack computer system. In addition, module 345 includes a sub module 347 which selects one or more sets of infrastructure support connections to which to allocate the rack computer system, such that the infrastructure support connections are "reserved" for connection with the rack computer system to provide one or more particular types of infrastructure support to the rack computer system. The one or more sets of infrastructure support connections to which the rack computer system can be allocated by sub module 347 can include a set of infrastructure support connections having associated attributes 314, 318 which were determined by one of modules 343 to correlate with one or more particular support requirements of the rack computer system.

Module 340 includes an output module 348 which is configured to generate one or more output commands based at least in part upon the allocation of one or more rack computer systems to one or more rack positions, infrastructure support connections, some combination thereof, etc. Output commands can be generated for transmission to one or more control systems which are configured to connection one end of various conduits, including network communication cabling, power cabling, etc. to one or more infrastructure support connections identified in the output commands; install one or more identified rack computer systems in one or more rack positions identified in the output commands, etc. In some embodiments, an output command includes an identification of one or more particular inbound rack computer systems and, for each rack computer system, identifies a particular rack position to which the rack computer system is allocated and commands installation of the rack computer system in the particular rack position, identifies one or more particular infrastructure support connections to which the rack computer system is allocated and commands connection of the rack computer system to the infrastructure support connections via one or more conduits, etc. In some embodiments, an output command identifies conduits having particular conduit types (e.g., a particular type of fiber optic cabling), dimensions (e.g., a particular length of cabling), etc. to connect the infrastructure support connections with the rack computer system and can further identify particular inventory sites from which to acquire such conduits. In some embodiments, output commands are generated for transmission to an operator.

Rack allocation system 300 includes a verification module 350 configured to verify whether a rack computer system which is allocated to one or more rack positions, infrastructure support connections, etc. is actually installed, connected, etc. in a data center according to the allocation of the rack computer system. Module 350 includes an allocation map module 352 which, based at least in part upon allocations of rack computer systems to various rack positions and infrastructure support connections, establishes a map of such allocations, where the map indicates rack positions which are allocated for installation of rack computer system, indicates infrastructure support connections which are allocated for connection to one or more rack computer systems, etc.

Module 350 includes a connection utilization map module 354 which is configured to establish a map of one or more of infrastructure support connections, rack positions, etc. which are actually utilized by one or more rack computer systems. Such a map can include a mapping of infrastructure support connections, included in one or more infrastructure modules in one or more data centers, which are actually connected with one or more rack computer systems; a mapping of rack positions in which one or more instances of equipment, infrastructure modules, rack computer systems, etc. are installed; etc. In some embodiments, module 354 establishes the map based at least in part upon communication, via module 330, with at least one external device, including at least a portion of one or more infrastructure modules, one or more infrastructure support connections, one or more computer systems monitoring data associated with operation of one or more infrastructure modules, etc. In some embodiments, module 354 establishes the map based at least in part upon data received from one or more operators.

Module 350 includes a comparison module 356 which is configured to compare an allocation map established by module 352 with a connection utilization map generated by module 354 to determine whether a mismatch is present between the allocation and actual installation and connection of a rack computer system in a data center. In response to determining the presence of such a mismatch, module 356 is configured to generate warning commands which can include commands to rectify the mismatch.

In some embodiments, module 356 can identify a particular rack computer system associated with the mismatch. For example, where a particular set of infrastructure support connections are indicated in the allocation map to be allocated to a particular rack computer system installed in a particular rack position, but another set of infrastructure support connections associated with the particular rack position are not allocated to be connected to any rack computer system, and the connection utilization map indicates both that the particular set of infrastructure support connections are not connected to any rack computer system while the other set of infrastructure support connections associated with particular rack position are connected, module 356 can determine that the particular rack computer system installed in the particular rack position is incorrectly connected to the other set of infrastructure support connections rather than the allocated particular set of infrastructure support connections. Warning commands can include a command to uninstall a particular rack computer system from one rack position and re-install the rack computer system in a different particular rack position, a command to change one or more particular connections of the rack computer system between different particular sets of infrastructure support connections, some combination thereof, or the like.

In some embodiments, one of the modules 343 is configured to compare each of the various sets of candidate rack positions identified by various modules 343 to determine whether at least one rack position is included in each of the sets of candidate rack positions. Such at least one rack position can be identified as a rack position with at least one set of infrastructure attributes which correlate with each of the support requirements of the rack computer system.

Figure 4:
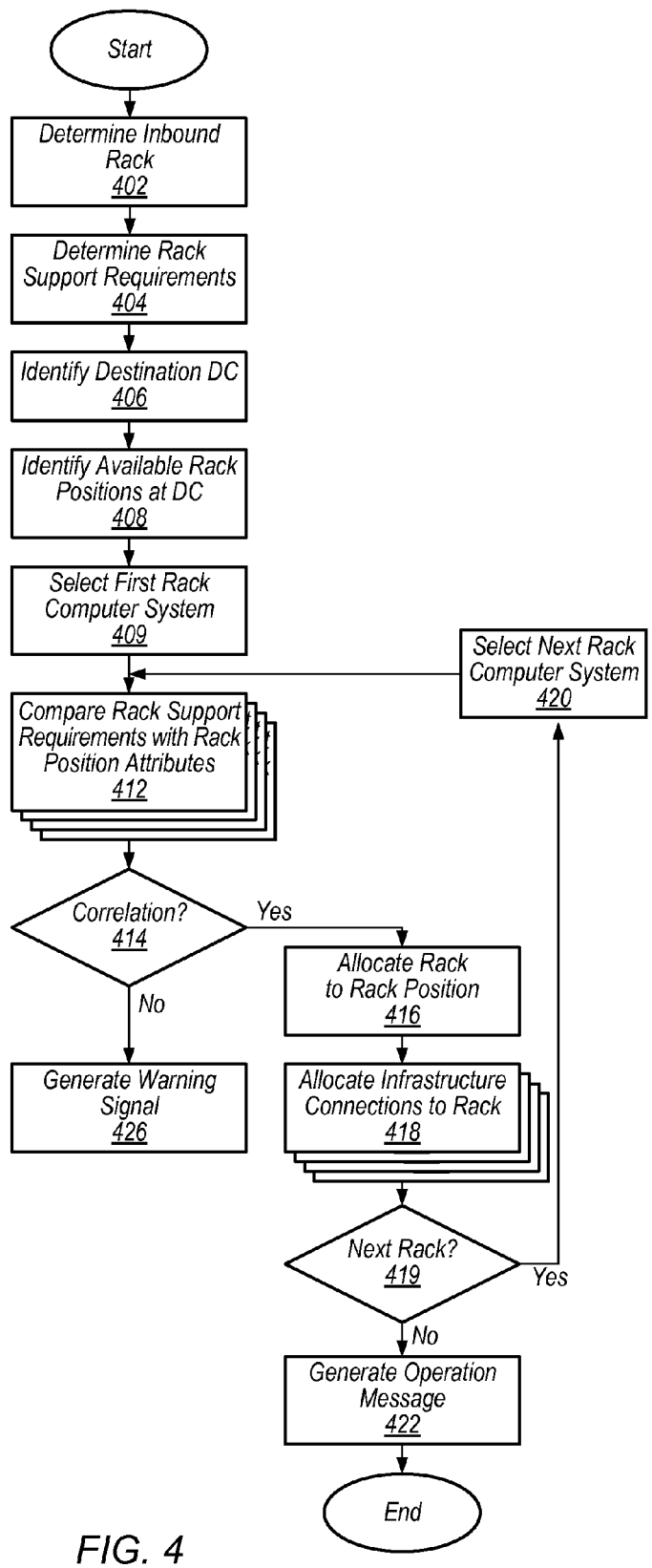
FIG. 4 illustrates associating various infrastructure attributes to rack positions in one or more data centers, according to some embodiments.

FIG. 4 illustrates associating various infrastructure attributes to rack positions in one or more data centers, according to some embodiments. The associating can be implemented, in full or in part, by some or all of a rack allocation system, as shown in FIGS. 1 and 3, which itself can be implemented, in full or in part, by some or all of one or more computer systems, as shown below in FIG. 7.

At 402, a determination is made that one or more rack computer systems are inbound for delivery to one or more data centers. Such a determination can be made based at least in part upon receiving a notification that one or more rack computer systems are presently inbound to one or more data centers for installation therein. Such a notification can include various information associated with the inbound rack computer systems, including manufacturer, type, etc. The information can include various specifications for the individual inbound rack computer systems, for a set of inbound rack computer systems, etc. Such specifications can include support requirements, for each of one or more types of infrastructure support, for one or more particular inbound rack computer systems. For example, a notification that three rack computer systems are inbound for installation can include support requirements for each of the three rack computer systems, as well as total support requirements of the three inbound rack computer systems, for each of multiple separate types of infrastructure support. A "presently inbound" rack computer system can include a rack computer system which has been ordered for delivery to the data center, a rack computer system which is presently inbound via one or more various modes of transportation, etc. Delivery via one or more various modes of transportation can include delivery via one or more delivery trucks, aircraft, watercraft, etc.

At 404, the computing capacity support requirements, also referred to herein as simply "support requirements", of the inbound rack computer systems are determined. Such determination can be based at least in part upon information included in a notification that the rack computer systems are presently inbound. Where the notification specifies a particular manufacturer and model of each inbound rack computer system, the determination can include identifying support requirements, for one or more various types of infrastructure support, for each of the inbound rack computer systems from an entry, in a local database of support requirements, associated with the identified manufacturer and model of the inbound rack computer system. In some embodiments, the notification specifies, for one or more of the inbound rack computer systems, support requirements for one or more particular types of infrastructure support.

Support requirements for one or more inbound rack computer systems can include, for each rack computer system, a set of requirements, where two or more requirements are each associated with a separate type of infrastructure support. For example, support requirements for a given rack computer system can include an electrical power support requirement of a particular magnitude of electrical power required to support computing operations by the rack computer system (e.g., 20 KVA); a power support redundancy requirement (e.g., N+1 redundancy); a particular network fabric required for communicative couplings between the rack computer system and one or more communication networks; a network support requirement which comprises a particular number of network switch devices to which the rack computer system is required to couple (e.g., 2 network switches), with a particular number of network ports per network switch device to which the rack computer system is required to be connected (e.g., 4 network ports per switch), a particular bandwidth requirement required to be provided via each connected network port (e.g., 10 megabytes/second); a console communication support requirement which comprises a particular number of console switch devices to which the rack computer system is required to couple, with a particular number of console ports per console switch device to which the rack computer system is required to be connected, a particular bandwidth requirement required to be provided via each connected console port, some combination thereof, etc. Such support requirements can be stored in a database entry associated with the particular manufacturer and model of the inbound rack computer system, such that the support requirements can be determined based at least in part upon notification of the particular model of the inbound rack computer system. In some embodiments, the support requirements are included with the notification that the rack computer systems are inbound. Where multiple rack computer systems are inbound, various rack computer systems can be associated with separate support requirements.

At 406, a destination data center for each of the inbound rack computer systems is determined. Such a determination can be made based at least in part upon a received indication that the one or more rack computer systems are inbound for delivery to the data centers, where the indication can include identification of the destination data center. At 408, based at least in part upon the determination of the destination data center for each of the inbound rack computer systems, a set of available rack positions in the destination data center are identified. The set of available rack positions can be identified based at least in part upon communication with a database of rack positions in one or more data centers, where each entry associated with a given rack position includes at least an identifier of the respective data center in which the rack position is located and an identifier of whether the rack position is unavailable. As referred to herein, an availability of a rack position can be determined based at least in part upon a determination regarding whether the rack position is unoccupied, presently configured to receive one or more particular types of infrastructure, etc. For example, a rack position which is unoccupied and is remote from an electrical power busway, such that electrical power support is unavailable to any rack computer systems which could be installed at the rack position, may be considered to be an unavailable rack position. In another example, a rack position which is unoccupied and is proximate to an electrical power connection may be considered to be an available rack position. An entry associated with a given rack position can include one or more sets of infrastructure support attributes associated with the given rack position.

In some embodiments, in response to a determination that a rack position is unavailable based at least in part upon a lack of a present configuration to receive at least a certain capacity of one or more types of infrastructure support, a command can be generated to install additional infrastructure support to configure said rack position to receive the one or more types of infrastructure support. For example, where an unoccupied rack position is determined to be insufficiently proximate to an electrical power busway to be configured to receive electrical power support at the rack position, the rack position can be determined to be unavailable and a command to install additional power busways, such that the rack position is configured to receive sufficient electrical power support so as to be considered available, can be generated. The command can be transmitted as a command signal to an operator associated with a data center in which the rack position is located. Such a determination and command generation can be implemented by one or more portions of a rack allocation system as described herein.

At 409, a first one of the set of inbound rack computer systems is selected. At 412, the support requirements of the rack computer system are compared with the infrastructure support attributes associated with the selected available rack positions in the destination data center to determine, for each support requirement, whether the support requirement correlates with the infrastructure support attributes of each of the set of rack positions. Such comparison can include comparing, in parallel, corresponding support requirements of one or more rack computer systems with attributes of each of the set of rack positions. For example, a set of support requirements of a rack computer system can include a particular network fabric, electrical power requirement, network switch and port requirements, console switch and port requirements, etc., and the infrastructure support attributes associated with each of the rack positions include a particular network fabric, one or more sets of electrical power connections configured to provide a certain amount of electrical power and a certain power redundancy, one or more sets of network ports associated with one or more various network module which each are configured to engage with particular conduit types and provide a certain amount of connection bandwidth, one or more sets of console ports associated with one or more various console modules which each are configured to engage with particular conduit types and provide a certain amount of connection bandwidth, etc. The network fabric indicated in the support requirements can be compared with the network fabric included in the infrastructure support attributes, the electrical power requirement in the support requirements can be compared with the electrical power capacity of one or more sets of electrical power connections included in the attributes, etc.

In some embodiments, a determination of a correlation includes determining whether each of the support requirements of a rack computer system are met by at least some of the infrastructure support attributes associated with a rack position. For example, where a set of support requirements of a rack computer system includes requirements for connections to network ports of two network switch devices, in separate configurations of forty (40) network ports per switch device, where the network ports each are configured to provide 10 MB/sec of bandwidth, and the network switch is associated with a certain type of network fabric, a correlation can be determined between the rack computer system support requirements and attributes of a rack position where said attributes include the connections of two separate network switches, where the connections include, for each separate network switch, the particular required configuration of forty network ports configured to provide at least 10 MB/sec of bandwidth and association with the particular network fabric. Where the rack position is associated with a particular network switch which includes forty available network ports in two separate groups which do not match the particular configuration of ports indicated in the support requirements, a correlation between the rack computer system support requirements and the rack position infrastructure support attributes may not be found based on the network ports included in the two separate groups in the particular network switch.

In some embodiments, where a correlation is found for a given support requirements with at least one corresponding attribute of one or more rack positions, a set of candidate rack positions is determined. Where a set of candidate rack positions is determined for each of the support requirements associated with a rack computer system, the sets of candidate rack positions are compared to determine whether one or more rack positions are included in each of the sets of candidate rack positions. Where at least one rack position is determined to be included in each set of candidate rack positions, a correlation between the rack computer system and the at least one rack position can be determined.

In some embodiments, a correlation for a given support requirement can be determined if the support requirement correlates with a corresponding infrastructure support attribute within a threshold margin. For example, where a support requirement includes a bandwidth requirement of 10 MB/s and an infrastructure support attribute includes a bandwidth capacity of a set of network ports which differs from the bandwidth requirement by less than 5% of the bandwidth requirement, the support requirement and corresponding attribute may be determined to be correlated. In some embodiments, one or more of an infrastructure support attribute, support requirement, etc., can include a configuration of one or more infrastructure support connections included in one or more infrastructure modules. For example, a support requirement of a rack computer system regarding network support requirements can include a requirement for a set of 40 network ports on a network switch, where the 40 ports are in a particular configuration. Such a configuration can include a physical arrangement, including a "block" arrangement of the ports, a contiguous arrangement of the ports, a particular association of the ports, etc. For example, where a network switch includes 40 available ports in two continuous groups of twenty ports each, an infrastructure support attribute of a rack position associated with the attributes of the network switch can include two separate configurations of twenty ports each.

In some embodiments, a rack position can include multiple sets of attributes which correspond to a single support requirement; such that a correlation of at least one attribute with the support requirement can result in the support requirements correlating with the attributes. For example, where a rack computer system has a power support requirement of 20 KVa, and the rack position includes attributes which include a set of electrical power connections configured to provide 10 KVa, a second set of electrical power connections configured to provide 15 KVa, and a third set of electrical power connections configured to provide 20 KVa, the power support requirement can be determined to correlate with the third set of electrical power connections. While each support requirement of the rack computer system may be required to correlate with at least one corresponding attribute, at least some attributes need not correlate with the corresponding support requirement.

In some embodiments, a support requirement of a rack computer system includes multiple tiers of subrequirements, where successive tiers of subrequirements are compared with corresponding attributes if preceding tiers of subrequirements are not found to correlate with any attributes. For example, where a rack computer system has a multi-tier set of power support subrequirements, where the first tier is a 20 KVa requirement, the next tier is a 15 KVa requirement, and the final tier is a 10 KVa requirement, the comparing 412 can include first comparing the 20 KVa requirement with corresponding power capacities of electrical power connections included in the rack position infrastructure support attributes; comparing the 15 KVa requirement with corresponding power capacities of electrical power connections if no correlation is found for the 20 KVa requirement; comparing the 10 KVa requirement with corresponding power capacities of electrical power connections if no correlation is found for the 15 KVa requirement, etc. If a correlation is found between a given tier of subrequirements and one or more attributes of one or more rack positions, a set of candidate rack positions is determined for the particular support requirement which includes the subrequirement.

It will be understood that, in some embodiments, each support requirement of multiple rack computer systems can be compared, in parallel with the corresponding attributes of multiple rack positions in a data center, including all rack positions. In some embodiments, rack computer systems are individually correlated with one or more rack positions in a sequential order.

At 414 and 426, if no correlation is found between the support requirements of a rack computer system and the infrastructure support attributes of at least one rack position, a warning signal is generated, indicating that no rack position is available for the rack computer system. In some embodiment, a determination can be made regarding whether the rack computer system can be correlated with a rack position at another data center where a separate rack computer system is inbound for delivery and, if the separate rack computer system is determined to correlate with a rack position in the first data center, the separate rack computer system can be rerouted for delivery to the first data center to offset the rerouting of the first rack computer system.

At 414 and 416, if the support requirements of a selected rack computer system are determined to correlate with the infrastructure support attributes of at least one available rack position in the destination data center, the rack computer system is allocated to be installed at the available rack position, such that the rack position is "reserved" for the rack computer system and is precluded from allocation by other rack computer systems. The allocation can include modifying a database entry of rack positions to change the allocated rack position from being indicated as "unoccupied" to being indicates as "occupied", modifying a database entry of rack positions to change the allocated rack position from being indicated as "available" to being indicated as "unavailable", some combination thereof, etc. In some embodiments, where the correlation determination at 414 includes a determination that the support requirements of the rack computer system correlate with the infrastructure support attributes of multiple available rack positions, one of the rack positions is selected for the allocation at 416. The selected rack position can be selected at random, based at least in part upon an ordering of the set of rack positions, an ordering of one or more types of identifiers associated with the various rack positions, etc.

In some embodiments, different rack positions in one or more data centers are proximate to different sets of infrastructure modules which can be configured to provide different capacities of various types of infrastructure support. As a result, the infrastructure support attributes of different rack positions in one or more data centers can be different. Therefore, the rack positions to which different rack computer systems are determined to correlate and are allocated can be different.

In some embodiments, allocation of a rack computer system to a particular rack position can be based at least in part upon the infrastructure support capacity for one or more particular types of infrastructure support correlating with a corresponding support requirement of the rack computer system for the one or more particular types of infrastructure within one or more margin thresholds. For example, while a rack computer system having a power support requirement of 15 KWa may correlate with a rack position having at least an associated infrastructure support attribute of electrical power support capacity of 15 KWa, a rack computer system having a power support requirement of 10 KWa may correlate most closely with a rack position having an associated infrastructure support attribute of electrical power support capacity of 10 KWa; as a result, the 10 KWa rack may not be allocated to the 15 KWa rack position, even though the power support requirement of the rack computer system may be met by the electrical power support available at the 15 KWa rack position, due to a closer correlation with the 10 KWa rack position.

In another example, while the electrical power support requirements of the 10 KWa rack computer system may be met by both a 12 KWa rack position and a 15 KWa rack position, the rack computer system may be allocated to the 12 KWa rack position over the 15 KWa rack position due to the correlation between the electrical power support capacity of the 12 KWa rack position and the electrical power support requirement of the 10 KWa rack computer system correlating within a 3 KWa margin. In contrast, the 15 KWa rack computer system may not be allocated to the 10 KWa rack position, due to the available power support at the rack position being unable to meet the support requirement of the 15 KWa rack computer system. As a result, where a set of rack computer systems being compared with various rack position attributes includes different rack computer systems with different support requirements, the different rack computer systems may be determined to correlate with different rack positions.

At 418, one or more infrastructure support connections included in the infrastructure support attributes of the allocated rack position in 416 are allocated to be connected with the rack computer system, such that the infrastructure support connections are allocated to be coupled with the rack computer system and provide one or more types of infrastructure support, via one or more connections with one or more conduits between the infrastructure support connections and connections of the rack computer system. The allocated infrastructure support connections can include the infrastructure support connections to which one or more corresponding support requirements of the rack computer system were determined, at 412 and 414, to be correlated. For example, where a rack computer system support requirement for two network switches, with four network ports per switch configured to support 10 MB/s bandwidth capacity, is determined at 412 to correlate with a particular set of available network ports included in each of two particular network switch devices, the allocating at 418 can include allocating those particular sets of network ports for connection to the rack computer system when the rack computer system is installed in the allocated rack position. The allocation can include modifying a database entry of infrastructure support connections, including modifying the infrastructure support attributes associated with various available rack positions, to change the allocated connections from being indicated as "available" to being indicates as "connected". Such modifying can include removing the allocated connections from inclusion in infrastructure support attributes, so that the allocated connections are not considered in subsequent comparisons of rack computer system support requirements and rack position infrastructure support attributes. In some embodiments, where the correlation determination at 414 includes a determination that the support requirements of the rack computer system correlate with multiple sets of infrastructure support connections of the allocated rack position, one of the sets of connections is selected for the allocation at 418. The selected set of connections can be selected at random, based at least in part upon an ordering of the set of connections, an ordering of one or more types of identifiers associated with the various connections, etc.

At 419, a determination is made regarding whether at least one additional rack computer system in the set of inbound rack computer systems is not yet allocated to a rack position. If so, at 420, the next rack computer system in the set is selected.

At 422, an output command is generated. The output command can include, for each of the rack computer systems in the set of rack computer systems, a set of commands associated with installation of the respective rack computer system in one or more rack positions, connection of the respective rack computer system with one or more sets of infrastructure support connections, etc. For example, where a rack computer system is allocated to a particular rack position at 416, and allocated to one or more sets of infrastructure support connections at 418, the command generated at 422 can include a command to, upon delivery of the rack computer system, install the rack computer system at the allocated rack position and connect the rack computer system to the allocated sets of infrastructure support connections. Where the command includes commands to connect the rack computer system to the allocated sets of infrastructure support connections, the command can include identifications of particular instances of conduits to use in establishing the connections, including identifications of particular conduit types (e.g., one or more particular types of fiber optic cabling, patch cabling, copper cabling, etc.) and particular lengths of such conduits (e.g., 5 feet, 12 feet, etc.). The command can include identifications of particular inventory storage locations from which to acquire said conduits, based at least in part upon communication with one or more inventory storage databases to identify available instances of conduits in storage.

Figure 5:
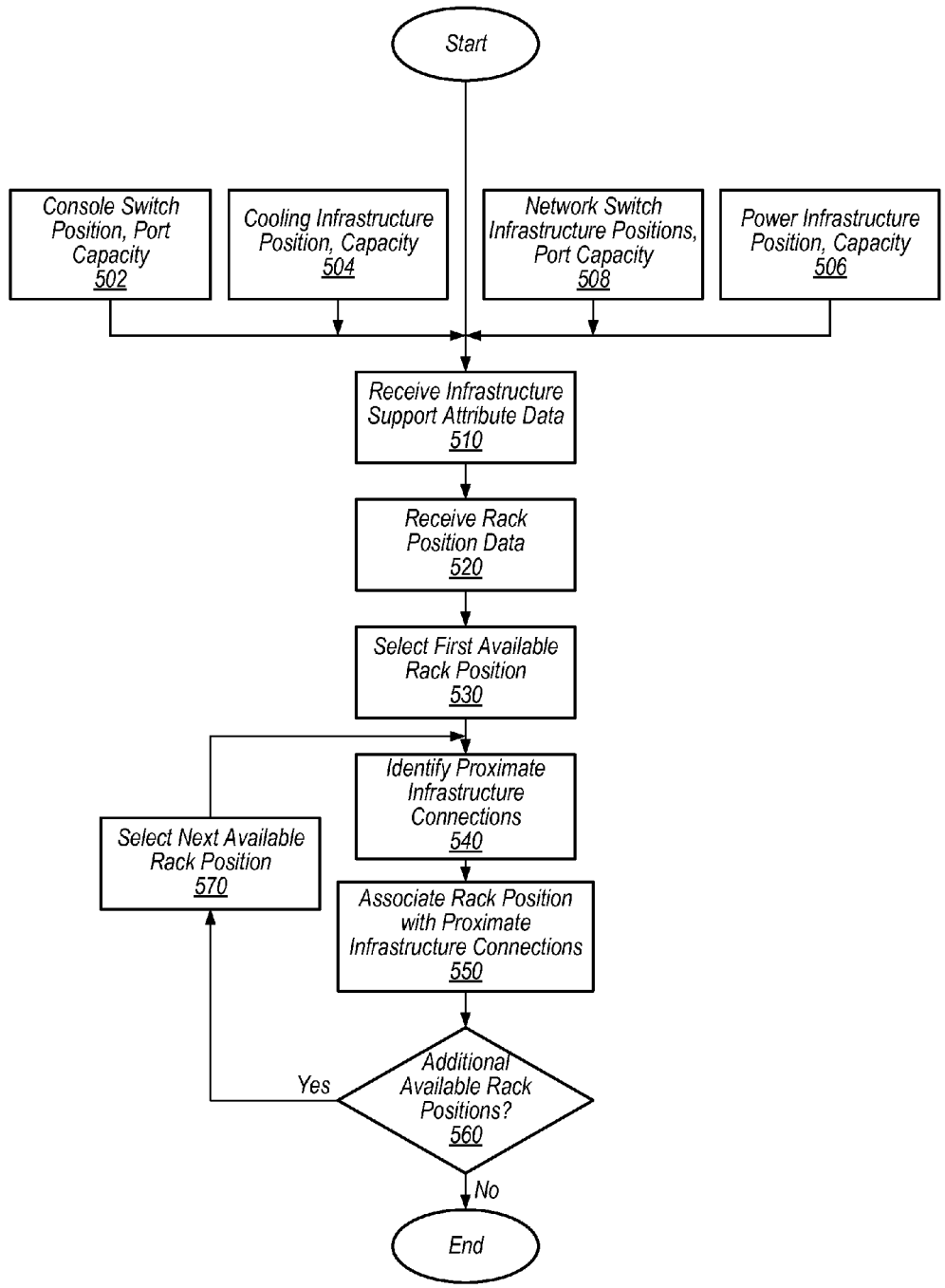
FIG. 5 illustrates managing incremental rack computer system allocation in one or more data centers based at least in part upon infrastructure attribute correlation, according to some embodiments.

FIG. 5 illustrates managing incremental rack computer system allocation in one or more data centers based at least in part upon infrastructure attribute correlation, according to some embodiments. The managing can be implemented, in full or in part, by some or all of a rack allocation system, as shown in FIGS. 1 and 3, which itself can be implemented, in full or in part, by some or all of one or more computer systems, as shown below in FIG. 7.

At 510, infrastructure support attribute data associated with various infrastructure modules in a data center is received. Such data can be received based at least in part upon the data being provided to a computer system by an operator. As illustrated, such data can include various sets of data 502-508 associated with various infrastructure modules configured to provide various types of infrastructure support in one or more data centers.

As shown at 502, some infrastructure support attribute data can include console communication support data associated with one or more console modules in one or more data centers. Such console modules can include one or more console switch devices, console routers, etc. Console communication support data 502 can include data identifying, for each console module in one or more data centers, one or more sets of console ports included in the respective console module which are configured to couple with one or more connections of one or more rack computer systems to enable console access support for the rack computer systems. Console communication support data 502 can include, for each set of console ports, indications of the support capacity of the respective sets of console ports to provide console access, a network fabric associated with the respective sets of console ports, a conduit type to which the respective sets of console ports are configured to be engaged, etc. For example, console communication support data 502 can include multiple sets of data for each of multiple console switch devices in a data center, where each set includes multiple subsets of data for each of the sets of console ports included in the respective console switch device, and each respective subset includes indications of the network fabric, conduit type, support capacity, etc. associated with the respective set of connections. In some embodiments, console communication support data includes, for each set of data for a given console module, an indication of a physical location of the console module in a data center. Such indication of physical location can be included in each subset associated with one or more sets of console ports, so that each subset indicates a physical location associated with the respective set of console ports.

As shown at 504, some infrastructure support attribute data can include cooling support data associated with one or more cooling modules in one or more data centers. Such cooling modules can include one or more air handling units, air moving devices, air cooling systems, etc. Cooling support data 504 can include data identifying, for each cooling module in one or more data centers, indications of the cooling capacity of the respective cooling module. In some embodiments, cooling support data includes, for each set of data for a given cooling module, an indication of a physical location of the cooling module in a data center.

As shown at 506, some infrastructure support attribute data can include power support data associated with one or more electrical power modules in one or more data centers. Such electrical power modules can include one or more power sources, transformers, switchgear assemblies, generators, uninterruptible power supplies (UPSs), automatic transfer switch (ATS) assemblies, power distribution units (PDUs), some combination thereof, etc. Power support data 506 can include data identifying, for each electrical power module in one or more data centers, one or more sets of electrical power connections included in the respective electrical power module which are configured to couple with one or more power connections of one or more rack computer systems to enable the electrical power module to distribute electrical power to the rack computer systems via the coupled connections. Power support data 506 can include, for each set of electrical power connections, indications of the electrical power capacity of the respective sets of electrical power connections, electrical voltage of the respective set of electrical power connections, electrical current of the respective set of electrical power connections, a conduit type to which the respective sets of electrical power connections are configured to be engaged, etc. For example, power support data 506 can include multiple sets of data for each of multiple electrical power modules in a data center, where each set includes multiple subsets of data for each of the sets of electrical power connections included in the respective electrical power modules, and each respective subset includes indications of the voltage, current, conduit type, electrical power capacity, etc. associated with the respective set of electrical power connections. In some embodiments, power support data includes, for each set of data for a given electrical power module, an indication of a physical location of the electrical power module in a data center. Such indication of physical location can be included in each subset associated with one or more sets of electrical power connections, so that each subset indicates a physical location associated with the respective set of electrical power connections.

As shown at 508, some infrastructure support attribute data can include network support data associated with one or more network modules in one or more data centers. Such network modules can include one or more network switch devices, network routers, etc. Network support data 508 can include data identifying, for each network module in one or more data centers, one or more sets of network ports included in the respective network module which are configured to couple with one or more connections of one or more rack computer systems to enable network access support for the rack computer systems. Network support data 508 can include, for each set of network ports, indications of the support capacity of the respective sets of network ports to provide network access, a network fabric associated with the respective sets of network ports, a conduit type to which the respective sets of network ports are configured to be engaged, etc. For example, network support data 508 can include multiple sets of data for each of multiple network switch devices in a data center, where each set includes multiple subsets of data for each of the sets of network ports included in the respective network switch device, and each respective subset includes indications of the network fabric, conduit type, support capacity, etc. associated with the respective set of connections. In some embodiments, network support data includes, for each set of data for a given network module, an indication of a physical location of the network module in a data center. Such indication of physical location can be included in each subset associated with one or more sets of network ports, so that each subset indicates a physical location associated with the respective set of network ports.

In some embodiments, at least some infrastructure support attribute data associated with one or more infrastructure modules is received based at least in part upon communication with the one or more infrastructure modules. For example, at least some networking infrastructure data 508, including indications of various available network ports of various network modules, network fabrics and support capacities associated with said connections, etc. can be received based at least in part upon communication, via a communication network, with said network modules to retrieve said data.

At 520, rack position data associated with various rack positions in a data center is received. Such data can be received based at least in part upon the data being provided to a computer system by an operator. Rack position data can include data identifying, for each rack position in one or more data centers, the particular data center and physical location within the data center of the rack position, an indication regarding whether the rack position is occupied by one or more instances of equipment, rack computer systems, infrastructure modules, etc. Rack position data, in some embodiments, includes one or more infrastructure support attributes associated with the rack position. Rack position data, in some embodiments, includes an indication of whether the rack position is presently configured to receive at least a certain magnitude, capacity, etc. of one or more particular types of infrastructure support. Rack position data can include an indication of whether a rack position is "available" for rack computer system installation therein, where the availability indication can be based at least in part upon whether the rack position is presently configured to receive at least a certain magnitude, capacity, etc. of one or more types of infrastructure support.

At 530, a first unoccupied rack position of the rack positions included in one or more data centers is selected. Rack positions can be indicated as unoccupied based at least in part upon one or more sets of rack position data associated with the respective rack position. At 540, infrastructure support connections, associated with various infrastructure modules, which are proximate to the selected unoccupied rack position are identified. Such identification, also referred to as a determination of one or more proximate infrastructure support connections relative to the rack position, can be based at least in part upon a comparison of a physical location associated with the rack position and a physical location associated with each of the one or more proximate infrastructure support connections. The infrastructure support connections can be determined to be proximate to the unoccupied rack position based at least in part upon a determination that the physical proximity of the infrastructure support connections to the rack position is less than a threshold amount. For example, where a set of network ports are included in a network switch device which is located in the same row of rack positions as a selected unoccupied rack position, the network ports can be determined to be proximate to the unoccupied rack position.

At 550, the selected unoccupied rack position is associated with the determined proximate infrastructure support connections. Such an association can include associating various infrastructure support attributes of the infrastructure support connections with the rack position. Such association of infrastructure support connections, and aspects thereof, with the rack position includes establishing the infrastructure support connections, and infrastructure support attributes thereof, as one or more infrastructure support attributes of the rack position. For example, where a set of network ports of a network switch device are determined to be proximate to a selected unoccupied rack position, and the network ports are associated with a particular network fabric, network communication cabling conduit type, and network access bandwidth associated with the network ports, the network fabric, conduit type, and bandwidth, along with the particular network ports themselves, are associated with the selected unoccupied rack position as infrastructure support attributes of the unoccupied rack position.

At 560 and 570, if additional unoccupied rack positions in the set of rack positions of one or more data centers are present, a next unoccupied rack position is selected and infrastructure support connections are associated therewith to establish infrastructure support attributes of the rack position.

In some embodiments, different rack positions in one or more data centers are proximate to different sets of infrastructure modules which can be configured to provide different capacities of various types of infrastructure support. As a result, the infrastructure support attributes of different rack positions in one or more data centers can be different.

Figure 6:
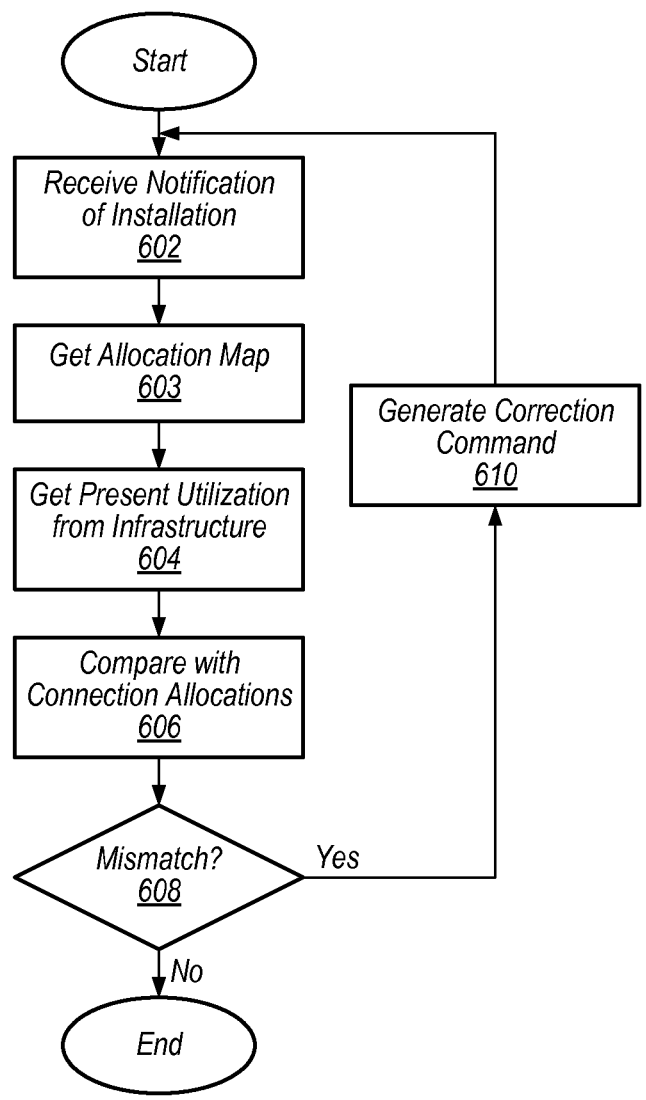
FIG. 6 illustrates verifying accurate installation of allocated rack computer systems in one or more rack positions and to one or more particular infrastructure connections, according to some embodiments.

FIG. 6 illustrates verifying accurate installation of allocated rack computer systems in one or more rack positions and to one or more particular infrastructure connections, according to some embodiments. The verifying can be implemented, in full or in part, by some or all of a rack allocation system, as shown in FIG. 1 and FIG. 3, which itself can be implemented, in full or in part, by some or all of one or more computer systems, as shown below in FIG. 7.

In some embodiments, subsequently to allocating one or more rack computer systems to one or more rack positions, where such allocation can include allocating the one or more rack computer systems to be connected with one or more particular infrastructure support connections associated with the rack positions as infrastructure support attributes, the actual installation of the rack computer system can be verified against the allocation of the rack computer system to verify that the rack computer system was installed in the rack position to which it was allocated, connected to the infrastructure support connections to which it was allocated, etc.

At 602, a notification that a previously-allocated rack computer system is installed in a data center. The notification can be based at least in part upon a manual entry of information by one or more users, via one or more user interfaces. In some embodiments, the notification is based at least in part upon the rack computer system being communicatively coupled with one or more network modules, including a main distribution frame, such that the rack computer system can be identified as installed based at least in part upon detection of communication between the rack computer system and one or more network modules included in the data center, some or all of one or more communication networks, etc. The notification can be received, in some embodiments, based at least in part upon a query submitted by a rack allocation system to one or more networking modules requesting identification of rack computer systems presently communicatively coupled to a communication network via the one or more networking modules. In some embodiments, the notification is received based at least in part upon a period communication between the rack allocation system and one or more various networking modules.

At 603, an allocation map which includes an identification of the various infrastructure support connections to which the rack computer system is allocated to be connected, based at least in part upon the rack computer system being allocated to a particular rack position. The allocation map can further identify infrastructure support connections are already connected to other rack computer systems and identify infrastructure support connections which are to remain unconnected to any rack computer systems as a result of the rack computer system being installed in the allocated rack position and connected to the allocated infrastructure support connections.

At 604, a connection utilization map is generated, based at least in part upon connection utilization data associated with one or more infrastructure modules, where the connection utilization map indicates which infrastructure support connections in a data center are actually connected to rack computer systems and providing infrastructure support thereto, rather than simply identify infrastructure support connections which are simply allocated to be connected to one or more rack computer systems. The connection utilization data associated with one or more infrastructure modules can be retrieved from the one or more infrastructure modules, based at least in part upon communication with said modules to retrieve said data. Such communication can include querying the modules for said data and receiving said data in response. In some embodiments, said utilization data is received from the infrastructure modules periodically without prompting. In some embodiments, where the utilization data associated with various infrastructure modules is stored at one or more databases which can be implemented on computer systems separate from the infrastructure modules, the utilization data can be retrieved from such computer systems.

At 606 and 608, the connection utilization map and the allocation map are compared to determine whether or not a mismatch is present between infrastructure support connections indicated to be connected to one or more rack computer systems in the respective maps. Because the allocation map can indicate the infrastructure support connections to which a rack computer system is allocated to be connected, and the connection utilization map can indicate the infrastructure support connections to which the rack computer system is actually connected upon installation, a mismatch between the infrastructure support connections indicated in the two maps to be connected to rack computer systems can indicate that a rack computer system is connected to infrastructure support connections to which the rack computer system was not allocated.

A determination of a mismatch can include a determination that an infrastructure support connection which is not allocated to be connected to any rack computer system, as indicated by the allocation map, is indicated by the connection utilization map to be connected to a rack computer system. Another determination of a mismatch can include a determination that an infrastructure support connection to which a rack computer system is allocated to be connected is indicated, by the connection utilization map, to be unconnected to any rack computer system.

At 610, if a mismatch is determined, a correction command is generated to remedy the mismatch. The command can be at least partially based upon which particular infrastructure support connections are associated with the determined mismatch, such that the command includes commands to change connections, installed rack positions, etc. for one or more particular rack computer systems. For example, where a mismatch determination includes a determination that a particular infrastructure support connection, indicated in the allocation map to be connected to a particular rack computer system, is not actually connected to any rack computer system, the command can include a command to connect the particular rack computer system to the particular infrastructure support connection. In some embodiments, where an infrastructure support connection associated with one or more particular rack positions is indicated by the connection utilization map to be connected to a rack computer system but is indicated in the allocation map to be unconnected, while another infrastructure support connection associated with a separate rack position is determined to be actually connected to a rack computer system but not allocated to same, the command can include a command to move a rack computer system from the particular rack position to the separate rack position.

Figure 7:
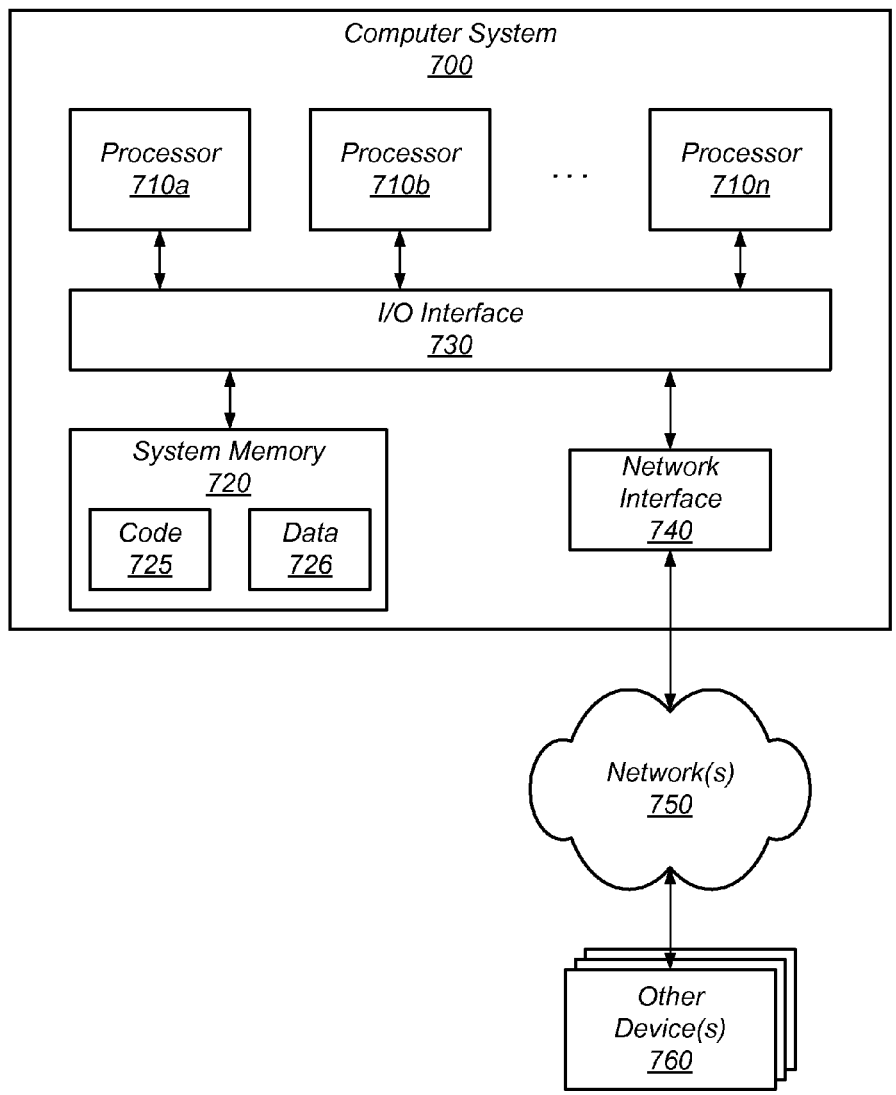
FIG. 7 is a block diagram illustrating an example computer system that may be used in some embodiments.

FIG. 7 is a block diagram illustrating an example computer system that may be used in some embodiments.

In some embodiments, a system that implements a portion or all of one or more of the technologies, including but not limited to a portion or all of infrastructure support attribute association with rack positions, allocation of rack computer systems to rack positions based on correlations of rack computer system support requirements and rack position infrastructure support attributes, rack allocation verification, and various methods, systems, devices, and apparatuses as described herein, may include a general-purpose computer system that includes or is configured to access one or more computer-accessible media, such as computer system 700 illustrated in FIG. 7. In the illustrated embodiment, computer system 700 includes one or more processors 710 coupled to a system memory 720 via an input/output (I/O) interface 730. Computer system 700 further includes a network interface 740 coupled to I/O interface 730.

In various embodiments, computer system 700 may be a uniprocessor system including one processor 710, or a multiprocessor system including several processors 710 (e.g., two, four, eight, or another suitable number). Processors 710 may be any suitable processors capable of executing instructions. For example, in various embodiments, processors 710 may be general-purpose or embedded processors implementing any of a variety of instruction set architectures (ISAs), such as the x86, PowerPC, SPARC, or MIPS ISAs, or any other suitable ISA. In multiprocessor systems, each of processors 710 may commonly, but not necessarily, implement the same ISA.

System memory 720 may be configured to store instructions and data accessible by processor(s) 710. In various embodiments, system memory 720 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of infrastructure support attribute association with rack positions, allocation of rack computer systems to rack positions based on correlations of rack computer system support requirements and rack position infrastructure support attributes, rack allocation verification, and various methods, systems, devices, and apparatuses as described herein, are shown stored within system memory 720 as code 725 and data 726.

In one embodiment, I/O interface 730 may be configured to coordinate I/O traffic between processor 710, system memory 720, and any peripheral devices in the device, including network interface 740 or other peripheral interfaces. In some embodiments, I/O interface 730 may perform any necessary protocol, timing or other data transformations to convert data signals from one component (e.g., system memory 720) into a format suitable for use by another component (e.g., processor 710). In some embodiments, I/O interface 730 may include support for devices attached through various types of peripheral buses, such as a variant of the Peripheral Component Interconnect (PCI) bus standard or the Universal Serial Bus (USB) standard, for example. In some embodiments, the function of I/O interface 730 may be split into two or more separate components, such as a north bridge and a south bridge, for example. Also, in some embodiments some or all of the functionality of I/O interface 730, such as an interface to system memory 720, may be incorporated directly into processor 710.

Network interface 740 may be configured to allow data to be exchanged between computer system 700 and other devices 760 attached to a network or networks 750, such as other computer systems or devices as illustrated in FIGS. 1 through 6, for example. In various embodiments, network interface 740 may support communication via any suitable wired or wireless general data networks, such as types of Ethernet network, for example. Additionally, network interface 740 may support communication via telecommunications/telephony networks such as analog voice networks or digital fiber communications networks, via storage area networks such as Fibre Channel SANs, or via any other suitable type of network and/or protocol.

In some embodiments, system memory 720 may be one embodiment of a computer-accessible medium configured to store program instructions and data for implementing embodiments of rack allocation management methods as described above relative to FIGS. 1-6. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 700 via I/O interface 730. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 700 as system memory 720 or another type of memory. Further, a computer-accessible medium may include transmission media or signals such as electrical, electromagnetic, or digital signals, conveyed via a communication medium such as a network and/or a wireless link, such as may be implemented via network interface 740.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   a set of infrastructure modules, wherein each infrastructure module in the set comprises at least one set of infrastructure support connections and is configured to provide a particular capacity of a particular type of infrastructure support to one or more rack computer systems via the at least one set of infrastructure support connections;
   a set of rack positions configured to accommodate one or more rack computer systems, wherein at least one rack position in the set of rack positions is an unoccupied rack position; and a rack allocation system configured to:
associate, based at least in part upon a determination of a physical proximity of the at least one set of infrastructure support connections to the unoccupied rack position, the at least one set of support connections, and the particular capacity of the particular type of infrastructure support provided by the at least one set of infrastructure support connections, with the unoccupied rack position as infrastructure support attributes of the unoccupied rack position; and
allocate one or more inbound rack computer systems to the unoccupied rack position based at least in part upon a determination that a set of infrastructure support requirements associated with the one or more inbound rack computer systems are met by at least some of the infrastructure support attributes of the unoccupied rack position.

2. The data center of claim 1, wherein:
the rack allocation system is configured to allocate the one or more inbound rack computer systems, allocated to the unoccupied rack position, to be connected to the at least one set of infrastructure support connections included in the set of infrastructure modules.

3. The data center of claim 2, wherein:
the rack allocation system is configured to determine, subsequently to installation of the inbound rack computer system in the unoccupied rack position and based at least in part upon communicating with the set of infrastructure modules, whether a mismatch is present between the allocation of the one or more inbound rack computer systems to the at least one set of infrastructure support connections and a subsequent actual connection of the rack computer system with one or more sets of infrastructure support connections.

4. A data center rack allocation system, comprising:
an infrastructure capacity module configured to communicate with one or more infrastructure modules in at least one data center to identify, for each infrastructure module, at least one available infrastructure support connection associated with the respective infrastructure module and configured to connect with one or more rack computer systems and provide a particular capacity of a particular type of infrastructure support to the one or more rack computer systems;
a rack position association module configured to associate, based at least in part upon a physical proximity of at least one unoccupied rack position with the one or more infrastructure modules, the at least one unoccupied rack position in the at least one data center with the at least one available infrastructure support connection as an infrastructure support attribute of the at least one unoccupied rack position; and
a rack allocation module configured to allocate a presently inbound rack computer system to be installed at the at least one unoccupied rack position in the at least one data center, based at least in part upon a determination of a correlation between one or more infrastructure support requirements of the inbound rack computer system and the infrastructure support attribute associated with the at least one unoccupied rack position.

5. The data center rack allocation system of claim 4, wherein:
the at least one available infrastructure support connection comprises one or more of:
a particular set of network ports, configured to connect with one or more rack computer systems via one or more particular types of network cabling and provide network access support, associated with one or more particular network fabrics, to the one or more connected rack computer systems;
a particular set of console ports, configured to connect with one or more rack computer systems via one or more particular types of network cabling and provide console access support, associated with one or more particular network fabrics, to the one or more connected rack computer systems; or
a particular set of branch circuit connections, configured to connect with one or more rack computer systems and provide one or more capacities of electrical power and one or more types of electrical power redundancy, to the one or more connected rack computer systems.

6. The data center rack allocation system of claim 4, wherein:
the one or more infrastructure support requirements of the inbound rack computer system comprise one or more of:
a particular network fabric associated with the inbound rack computer system;
one or more particular magnitudes of electrical power required to support one or more levels of computing operations by the inbound rack computer system;
one or more particular electrical power redundancies required to support computing operations by the inbound rack computer system;
a particular quantity of network switch devices, and a particular quantity of network ports per network switch device, required to support computing operations by the inbound rack computer system; or
a particular quantity of console switch devices, and a particular quantity of console ports per console switch device, required to support computing operations by the inbound rack computer system.

7. The data center rack allocation system of claim 4, wherein:
the rack position association module is configured to associate the at least one unoccupied rack position in the data center with a particular network fabric, based at least in part upon a network fabric associated with the at least one available infrastructure support connection of one or more infrastructure modules.

8. The data center rack allocation system of claim 4, wherein:
to allocate a presently inbound rack computer system to be installed at the at least one unoccupied rack position, the rack allocation module is further configured to allocate the at least one available infrastructure support connection to be connected with one or more particular connections of the presently inbound rack computer system.

9. The data center rack allocation system of claim 8, comprising:
a verification module configured to determine, based at least in part upon communicating with one or more infrastructure modules subsequently to installation of the inbound rack computer system in the at least one unoccupied rack position, if a mismatch is present between the allocation of the at least one available infrastructure support connection to be connected to a particular connection of the presently inbound rack computer system and a subsequent connection of the rack computer system with one or more infrastructure support connections of one or more infrastructure modules.

10. The data center rack allocation system of claim 4, wherein:

to allocate a presently inbound rack computer system to be installed at the at least one unoccupied rack position, based at least in part upon a determination of a correlation between one or more infrastructure support requirements of the inbound rack computer system and the infrastructure support attributes associated with the at least one unoccupied rack position, the rack allocation module is configured to determine that the one or more infrastructure support requirements of the inbound rack computer system correlate with an infrastructure support attribute within a certain threshold margin.

11. A method, comprising:

performing, by at least one computer system:
incrementally allocating rack computer systems to rack positions in a data center, wherein the incrementally allocating comprises:
associating at least one rack position, of a plurality of rack positions in the data center, with one or more infrastructure support attributes of a particular set of available infrastructure support connections, which are each associated with one or more infrastructure modules and configured to provide one or more types of infrastructure support, as infrastructure support attributes of the at least one rack position based at least in part upon communication with the one or more infrastructure modules to identify infrastructure support connections associated with said infrastructure modules;
determining a set of infrastructure support requirements associated with at least one rack computer system, based at least in part upon a determination that the at least one rack computer system is presently inbound to be delivered to the data center; and
allocating the at least one rack computer system to be installed in the at least one rack position, based at least in part upon a determination that the set of infrastructure support requirements associated with the at least one rack computer system are met by the infrastructure support attributes associated with the at least one rack position.

12. The method of claim 11, wherein:

the particular set of available infrastructure support connections associated with one or more infrastructure modules comprises one or more of:
a particular set of network ports, configured to connect with one or more rack computer systems via one or more particular types of network cabling and provide network access support, associated with one or more particular network fabrics, to the one or more connected rack computer systems;
a particular set of console ports, configured to connect with one or more rack computer systems via one or more particular types of network cabling and provide console access support, associated with one or more particular network fabrics, to the one or more connected rack computer systems; or
a particular set of branch circuit connections, configured to connect with one or more rack computer systems and provide one or more capacities of electrical power and one or more types of electrical power redundancy, to the one or more connected rack computer systems.

13. The method of claim 11, wherein:

the set of infrastructure support requirements associated with at least one rack computer system comprise one or more of:
a particular network fabric associated with the inbound rack computer system;
one or more particular magnitudes of electrical power required to support one or more levels of computing operations by the inbound rack computer system;
one or more particular electrical power redundancies required to support computing operations by the inbound rack computer system;
a particular quantity of network switch devices, and a particular quantity of network ports per network switch device, required to support computing operations by the inbound rack computer system; or
a particular quantity of console switch devices, and a particular quantity of console ports per console switch device, required to support computing operations by the inbound rack computer system.

14. The method of claim 11, wherein:

associating at least one rack position, of a plurality of rack positions in the data center, with one or more infrastructure support attributes of a particular set of available infrastructure support connections is based at least in part upon a determination of a physical proximity of the particular set of available infrastructure support connections with the at least one rack position.

15. The method of claim 11, wherein:

associating at least one rack position with one or more infrastructure support attributes of a particular set of available infrastructure support connections comprises associating the at least one rack position with a particular network fabric associated with the particular set of available infrastructure support connections.

16. The method of claim 11, wherein the incrementally allocating comprises:

allocating the particular set of available infrastructure connections to the inbound rack computer system, in response to allocating the presently inbound rack computer system to be installed at the at least one rack position.

17. The method of claim 16, wherein the incrementally allocating comprises:

communicating with the one or more infrastructure modules, subsequently to installation of the rack computer system in the at least one rack position, to determine if a mismatch is present between the allocation of the particular set of available infrastructure connections to the rack computer system and a subsequent connection of the rack computer system with one or more infrastructure support connections of the one or more infrastructure modules.

18. The method of claim 11, wherein:

the determination that the set of infrastructure support requirements associated with inbound rack computer system are met by the set of available infrastructure support connections associated with the at least one rack position comprises a determination that the set of infrastructure support requirements correlate with the infrastructure support attributes within a certain threshold margin.

* * * * *